United States Patent
Yim et al.

(10) Patent No.: US 11,437,094 B2
(45) Date of Patent: *Sep. 6, 2022

(54) NONVOLATILE MEMORY DEVICE, STORAGE DEVICE, AND OPERATION METHOD OF STORAGE DEVICE

(71) Applicant: SAMSUNG ELECTRONICS CO., LTD., Suwon-si (KR)

(72) Inventors: Hyejin Yim, Wonju-si (KR); Sung-Won Yun, Suwon-si (KR); Il Han Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/018,097

(22) Filed: Sep. 11, 2020

(65) Prior Publication Data

US 2020/0411086 A1  Dec. 31, 2020

Related U.S. Application Data

(60) Continuation-in-part of application No. 16/108,408, filed on Aug. 22, 2018, now Pat. No. 10,777,264.
(Continued)

(30) Foreign Application Priority Data

Aug. 13, 2015  (KR) .......................... 10-2015-0114801

(51) Int. Cl.
*G06F 11/07* (2006.01)
*G11C 11/56* (2006.01)
(Continued)

(52) U.S. Cl.
CPC ...... *G11C 11/5628* (2013.01); *G06F 11/0793* (2013.01); *G11C 16/10* (2013.01); *G11C 16/3459* (2013.01); *G11C 16/0483* (2013.01)

(58) Field of Classification Search
CPC .............. G06F 11/0793; G06F 11/076; G06F 11/0763; G06F 11/0766; G06F 11/0787
(Continued)

(56) References Cited

U.S. PATENT DOCUMENTS 7,440,319 B2  10/2008  Li et al.
7,746,703 B2   6/2010  Kim et al.
(Continued)

FOREIGN PATENT DOCUMENTS

CN  101174463 A   5/2008
CN  102403039 A   4/2012
(Continued)

*Primary Examiner* — Chae M Ko
(74) *Attorney, Agent, or Firm* — Lee IP Law, P.C.

(57) ABSTRACT

A memory device includes: a first substrate; a peripheral circuit provided on the first substrate; a first metal bonding layer provided on the peripheral circuit; a second metal bonding layer directly bonded to the first metal bonding layer; a memory cell array provided on the second metal bonding layer; and a second substrate provided on the memory cell array. A page buffer circuit in the peripheral circuit receives a verification result through the metal bonding layers, divides the verification result into stages, and sequentially outputs the verification result for the division into the stages, and a pass/failure checker in the peripheral circuit sequentially performs a counting operation about each of the stages to generate accumulated values, and compares the accumulated values and a reference value which increases from an initial value as the counting operation is performed, and the initial value is set by an external memory controller.

20 Claims, 26 Drawing Sheets

Related U.S. Application Data which is a division of application No. 15/155,162, filed on May 16, 2016, now Pat. No. 10,061,633.

(51) Int. Cl.
  *G11C 16/34* (2006.01)
  *G11C 16/10* (2006.01)
  G11C 16/04 (2006.01)

(58) Field of Classification Search
  USPC .................................................. 714/6.1, 54
  See application file for complete search history.

(56) References Cited

U.S. PATENT DOCUMENTS

| | | | |
|---|---|---|---|
| 7,848,141 B2 | 12/2010 | Seong et al. | |
| 7,872,941 B2 | 1/2011 | Jung | |
| 8,458,537 B2 | 6/2013 | Komai | |
| 8,599,613 B2 | 12/2013 | Abiko et al. | |
| 8,661,294 B2 | 2/2014 | Lee et al. | |
| 8,730,740 B2 | 5/2014 | Komai | |
| 9,037,929 B2 | 5/2015 | Lee et al. | |
| 9,064,582 B2 | 6/2015 | Song et al. | |
| RE45,603 E | 7/2015 | Hemink | |
| 9,349,476 B2 | 5/2016 | Pe'Er | |
| RE46,435 E | 6/2017 | Scheuerlein et al. | |
| 2008/0002468 A1 | 1/2008 | Hemink | |
| 2008/0062760 A1 | 3/2008 | Kim | |
| 2008/0158989 A1 | 7/2008 | Wan et al. | |
| 2010/0195411 A1 | 8/2010 | Abiko | |
| 2010/0315880 A1 | 12/2010 | Joo | |
| 2011/0051514 A1 | 3/2011 | Han et al. | |
| 2011/0305081 A1 | 12/2011 | Lee | |
| 2012/0140566 A1 | 6/2012 | Aritome | |
| 2012/0155186 A1 | 6/2012 | Chokan et al. | |
| 2012/0239858 A1 | 9/2012 | Melik-Martirosian | |
| 2012/0314500 A1 | 12/2012 | Song et al. | |
| 2012/0314504 A1 | 12/2012 | Komai | |
| 2013/0019050 A1* | 1/2013 | Somanache | G06F 13/1668 711/E12.008 |
| 2013/0159610 A1 | 6/2013 | Kawamura | |
| 2013/0159785 A1 | 6/2013 | Hashimoto | |
| 2013/0208541 A1 | 8/2013 | Yoon et al. | |
| 2014/0010026 A1 | 1/2014 | Kim et al. | |
| 2014/0043914 A1 | 2/2014 | Shim | |
| 2015/0036435 A1 | 2/2015 | Kang et al. | |
| 2015/0179659 A1 | 6/2015 | Takaki | |
| 2015/0254129 A1 | 9/2015 | Authement et al. | |
| 2016/0055919 A1 | 2/2016 | Park et al. | |
| 2016/0196062 A1 | 7/2016 | Nakata et al. | |
| 2016/0225439 A1 | 8/2016 | Kim | |
| 2016/0292007 A1* | 10/2016 | Ding | G06F 9/5077 |
| 2016/0351272 A1 | 12/2016 | Sanasi | |
| 2017/0075595 A1* | 3/2017 | Maejima | G06F 11/0793 |
| 2017/0271025 A1* | 9/2017 | Suzuki | G11C 16/10 |
| 2017/0278581 A1* | 9/2017 | Takizawa | G11C 16/3445 |

FOREIGN PATENT DOCUMENTS

| | | |
|---|---|---|
| CN | 102483953 A | 5/2012 |
| CN | 102820057 A | 12/2012 |
| KR | 20120136116 | 12/2012 |

\* cited by examiner

[1st Section]

[2nd Section]

NONVOLATILE MEMORY DEVICE, STORAGE DEVICE, AND OPERATION METHOD OF STORAGE DEVICE

CROSS-REFERENCE TO RELATED APPLICATIONS

This application is a continuation-in-part (CIP) of U.S. patent application Ser. No. 16/108,408, filed on Aug. 22, 2018, which is a divisional application based on U.S. patent application Ser. No. 15/155,162, filed on May 16, 2016, which claims priority under 35 U.S.C. § 119 to Korean Patent Application No. 10-2015-0114801, filed on Aug. 13, 2015, in the Korean Intellectual Property Office, the disclosure of each of which is incorporated by reference herein in its entirety.

BACKGROUND

1. Field

One or more embodiments described herein relate to a nonvolatile memory device, program method, and program verification method.

2. Description of the Related Art

A semiconductor memory is fabricated from one or more semiconductor materials including silicon (Si), germanium (Ge), gallium arsenide (GaAs), indium phosphide (InP), or the like.

Semiconductor memory devices include volatile memory devices and a nonvolatile memory device. One kind of nonvolatile memory device known as a flash memory device is used in various fields because of its fast operating speed, low power, low noise, and high capacity characteristics. A flash memory device may program data using an incremental step pulse programming (ISPP) scheme. In this scheme, data is programmed by performing a plurality of program loops. Each program loop may include a program step in which a program pulse is applied to a word line and a verification step in which states of memory cells are verified.

In the verification step, program pass or program failure is determined according to the result of counting failure bits (e.g., memory cells not programmed to a target program state). A next program loop is performed according to the result of this determination. The time to perform a failure bit counting operation may be longer than the time to perform the program step or a verification read operation. Thus, execution of a next program loop may be delayed due to a long counting operation. This decreases total program speed.

SUMMARY

In accordance with one or more embodiments, a memory device includes: a first substrate; a peripheral circuit provided on the first substrate, the peripheral circuit including a page buffer circuit and a pass/fail (P/F) checker; a first metal bonding layer provided on the peripheral circuit; a second metal bonding layer provided on the first metal bonding layer, and directly bonded to the first metal bonding layer; a memory cell array provided on the second metal bonding layer, and electrically connected to the peripheral circuit through the first metal bonding layer and the second metal bonding layer; and a second substrate provided on the memory cell array. The page buffer circuit is configured to receive a verification read result at a verification read operation on the memory cell array through the first metal bonding layer and the second metal bonding layer, to divide the verification read result into a plurality of stages, and to sequentially output the verification read result for the division into the plurality of stages, and the P/F checker is configured to sequentially perform a failure bit counting operation about each of the plurality of stages to generate a plurality of failure bit accumulated values, and compare the failure bit accumulated values and a reference value to output one of a pass signal and a failure signal, the reference value increases from an initial value as the failure bit counting operation is performed, and the initial value is set by an external memory controller.

The memory cell array is connected to a plurality of bit lines, the page buffer circuit includes a plurality of page buffers connected to the plurality of bit lines through the first and second metal bonding layers, respectively, and the plurality of page buffers are divided into the plurality of stages.

The P/F checker includes a counting unit configured to sequentially perform a failure bit counting operation about each of the plurality of stages to generate counting values; an accumulating unit configured to accumulate the counting values to generate the failure bit accumulated values; a reference value managing unit configured to control the reference value based on a progress of the failure bit counting operation; a comparing unit configured to compare the failure bit accumulated values and the reference value to output one of the pass signal and the failure signal based on a result of the comparison.

The peripheral circuit further includes a control circuit configured to transmit a transmission signal to the page buffer circuit, and the page buffer circuit sequentially outputs the verification read result, for the division into the stages, in response to the transmission signal.

The control circuit is further configured to transmit transmission information to the P/F checker, and the transmission information includes information corresponding to a number of activated stages from among the plurality of stages.

The P/F checker increases the reference value in response to the transmission information.

The peripheral circuit further includes metal layers provided between the first metal bonding layer, and the page buffer circuit and the P/F checker.

The verification read result is transmitted from the page buffer circuit to the P/F checker through the metal layers.

An upper input/output (I/O) pad is provided on the second substrate, the upper I/O pad is electrically connected to the peripheral circuit through the first metal bonding layer and the second metal bonding layer, and information corresponding to the initial value is received from the external memory controller through the upper I/O pad.

A lower input/output (I/O) pad is provided under the first substrate, information corresponding to the initial value is received from the external memory controller through the lower I/O pad.

In accordance with one or more embodiments, a storage device including a nonvolatile memory device and a memory controller configured to control the nonvolatile memory device, an operation method of the storage device includes transmitting, by the memory controller, a first command to the nonvolatile memory device; transmitting, by the nonvolatile memory device, device information to the memory controller in response to the first command; determining, by the memory controller, a pass/failure mode and a reference value based on the device information; transmitting, by the memory controller, a second command including information corresponding to the determined pass/failure mode and the determined reference value to the nonvolatile memory device; setting, by the nonvolatile memory device, the pass/failure mode and the reference value; transmitting, by the memory controller, a program command and data to the nonvolatile memory device; and performing, by the nonvolatile memory device, a program operation for the data in response to the program command. The program operation includes a program step and a verification step, and the verification step is performed based on the set pass/failure mode and the set reference value.

The set reference value includes a first failure reference value and a second failure reference value different from the first failure reference value, the verification step includes: performing a first failure bit counting operation about a first stage of a plurality of stages to generate a first failure bit accumulated value; comparing the first failure bit accumulated value and the first failure reference value to determine a program failure; and when the first failure bit accumulated value is less than the first failure reference value; performing a second failure bit counting operation about a second stage of the stages to generate a second failure bit accumulated value; and comparing the second failure bit accumulated value and the second failure reference value.

The comparing the first failure bit accumulated value includes determining a case that the first failure bit accumulated value is less than the first pass reference value as being a program pass.

When the first failure bit accumulated value is less than the first pass reference value, the performing a second failure bit counting operation and the comparing the second failure bit accumulated value and the second failure reference value are skipped.

The first failure reference value is less than the second failure reference value.

The device information includes a number of program/erase cycles of the nonvolatile memory device, and the reference value is determined based on the number of program/erase cycles.

In accordance with one or more embodiments, a storage device includes a nonvolatile memory device; and a memory controller configured to set an initial reference value based on device information of the nonvolatile memory device. The nonvolatile memory device includes: a memory cell array; a page buffer circuit configured to store a verification read result at a verification read operation on the memory cell array, to divide the verification read result into a plurality of stages, and to sequentially output the verification read result for the division into the plurality of stages; and a pass/failure (P/F) checker configured to sequentially perform a failure bit counting operation about each of the plurality of stages to generate a plurality of failure bit accumulated values, and compare the failure bit accumulated values and a reference value to output one of a pass signal and a failure signal, the reference value increases from the initial reference value as the failure bit counting operation is performed.

The nonvolatile memory device further comprises a first substrate and a second substrate, and the memory cell, the page buffer circuit, and the P/F checker are provided between the first substrate and the second substrate.

The nonvolatile memory device further comprises: a first metal bonding layer electrically connected to the page buffer circuit; and a second metal bonding layer electrically connected to the memory cell array, the second metal bonding layer is directly bonded to the first metal bonding layer.

The page buffer is further configured to receive the verification read result from the memory cell array through the first metal bonding layer and the second metal bonding layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
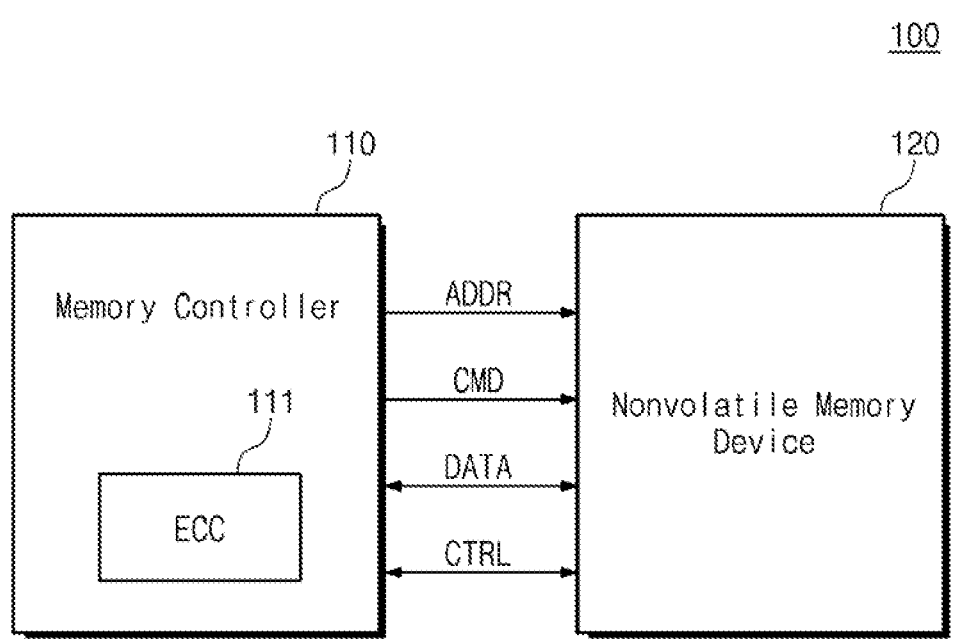
FIG. 1 illustrates an embodiment of a nonvolatile memory system.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

A nonvolatile memory device according to example embodiments may program memory cells by performing a plurality of program loops. Each of the program loops may include a program step and a verification step, and the verification step may include a verification read operation and a failure bit counting operation.

The nonvolatile memory device may determine program pass or program failure by generating a counting value and a cumulative value through a counting operation about each of a plurality of stages at the failure bit counting operation and comparing the cumulative value and a reference value (or, a variable reference value). The nonvolatile memory device may perform a next program loop based on program pass or program failure. At this time, the nonvolatile memory device may change a reference value, corresponding to each stage, during the failure bit counting operation, and thus the nonvolatile memory device may determine program pass or program failure in advance before failure bit counting operations about all stages are performed. Counting operations about remaining stages may be skipped after program pass or program failure is determined. Thus, overhead due to the failure bit counting operation may be reduced. This means that the program performance of the nonvolatile memory device is improved.

FIG. 1 illustrating an embodiment of a nonvolatile memory system 100 which includes a memory controller 110 and a nonvolatile memory device 120. In example embodiments, the nonvolatile memory system 100 may be implemented with one chip, one semiconductor package, or one module. Alternatively, each of the memory controller 110 and the nonvolatile memory device 120 of the nonvolatile memory system 100 may be implemented with one chip, one semiconductor package, or one module. The nonvolatile memory system 100 may be connected to an external device (e.g., a host, an application processor, or the like) and may be used as a storage medium of the external device. The nonvolatile memory system 100 may be, for example, a memory card, a memory stick, or a mass storage medium such as a solid state drive (SSD).

The memory controller 110 may control the nonvolatile memory device 120, for example, under control of an external device. The memory controller 110 may transmit an address ADDR and a command CMD to the nonvolatile memory device 120 or may exchange data and a control signal CTRL with the nonvolatile memory device 120. For example, to store data in the nonvolatile memory device 120, the memory controller 401a may transmit an address ADDR, a command CMD, data, and a control signal CTRL to the nonvolatile memory device 120. To read data from the nonvolatile memory device 120, the memory controller 110 may transmit an address ADDR, a command CMD, and a control signal CTRL to the nonvolatile memory device 120.

In example embodiments, the memory controller 110 may transmit an address ADDR and a command CMD to the nonvolatile memory device 120 and may exchange data and a control signal CTRL with the nonvolatile memory device 120.

The memory controller 110 may include an error correction circuit (ECC) 111. The ECC 111 may detect and correct an error of data read from the nonvolatile memory device 120. For example, the ECC 111 may generate an error correction code about first data to be stored in the nonvolatile memory device 120. The ECC 111 may read the first data from the nonvolatile memory device 120 and may detect and correct an error of the first data based on the error correction code about the first data. In example embodiments, the ECC 111 may have the error correction capacity. For example, the ECC 111 may detect and correct error bits within the error correction capacity.

The nonvolatile memory device 120 may operate according to control of the memory controller 110. For example, the nonvolatile memory device 120 may store (or program) data in response to a signal from the memory controller 110. The nonvolatile memory device 120 may read out the stored data in response to a signal from the memory controller 110.

In example embodiments, the nonvolatile memory device 120 may include a NAND flash memory. In another embodiment, the nonvolatile memory device 120 may include another type of memory, including but not limited to a phase-change random access memory (PRAM), a resistive RAM (ReRAM), a ferroelectric RAM (FRAM), a magnetoresistive RAM (MRAM), or a NOR flash memory, or a combination thereof.

In example embodiments, the nonvolatile memory device 120 may store (or program) data from the memory controller 110 based on an incremental step pule programming (ISPP) scheme. The ISPP scheme may include a plurality of program loops. Each program loop may include a program step in which a program voltage is applied to a selected word line and a verification step in which memory cells connected to the selected word line are verified. Each program loop may be performed according to a verification result of a verification step in a previous program loop. For example, a second program loop may be executed in the case where a verification result of a verification step in a first program loop indicates program failure and may not be performed in the case where the verification result of the verification step in the first program loop indicates program pass.

In example embodiments, the verification step may include a verification read operation in which program states of selected memory cells are read and a determination operation in which program failure or program pass is determined according to a result of counting a failure bit of data (or value) read through the verification read operation.

During the determination operation, the number of failure bits may be detected, and program failure or program pass may be determined by comparing the number of failure bits and a reference value. In example embodiments, the reference value may be determined according to the number of error bits capable of being corrected by the ECC 111 or a read margin of the nonvolatile memory device 120.

The nonvolatile memory device 120 according to example embodiments may change the reference value for determining program failure or program pass during a determination operation of a verification step, thereby making it possible to determine program failure or program pass in advance. Thus, the program speed of the nonvolatile memory device 120 may be improved. The nonvolatile memory device 120 and an operating method thereof will be described with reference to accompanying drawings.

Figure 2:
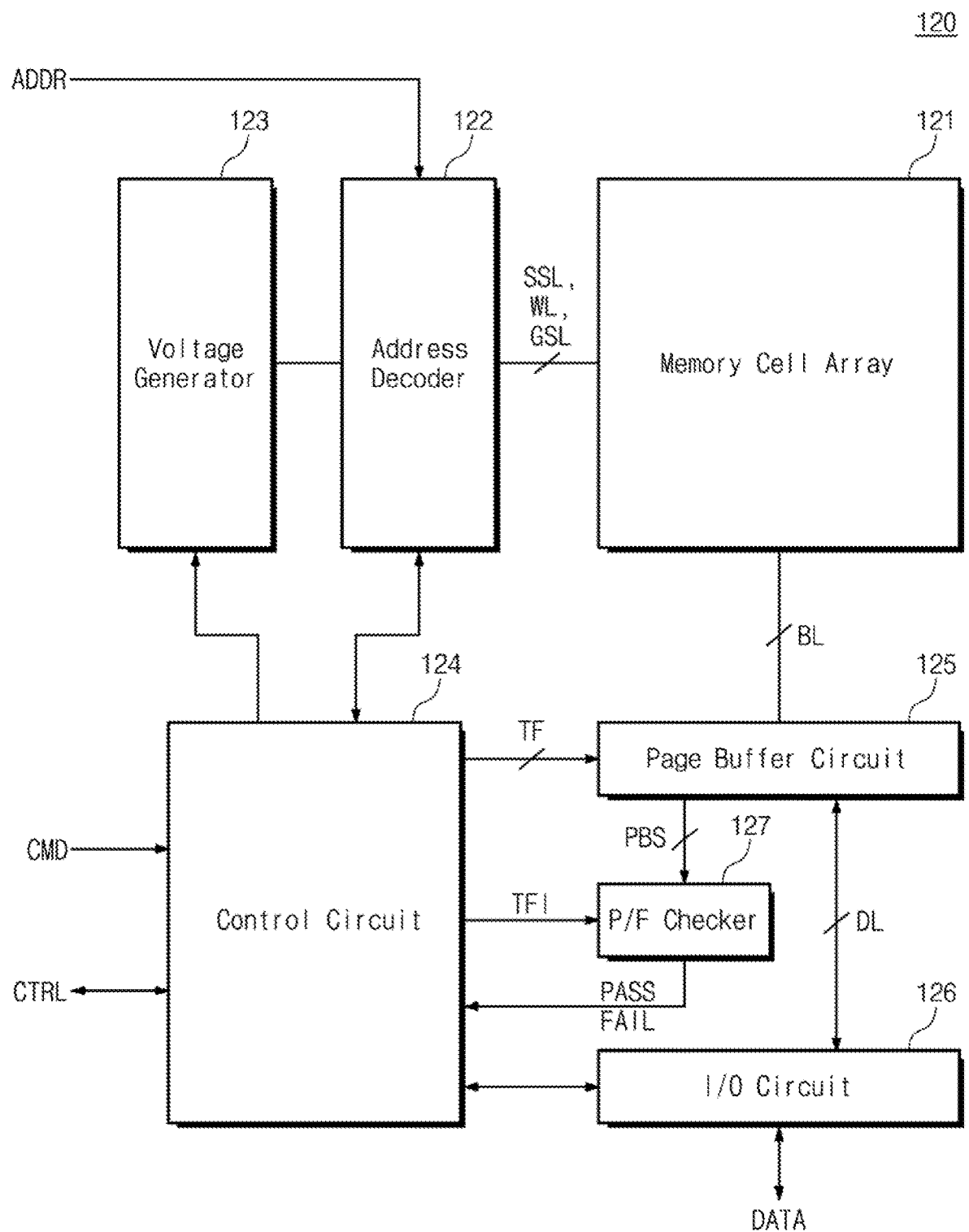
FIG. 2 illustrates an embodiment of a nonvolatile memory device.

FIG. 2 is a block diagram illustrating a nonvolatile memory device of FIG. 1. Referring to FIGS. 1 and 2, a nonvolatile memory device 120 may include a memory cell array 121, a row or address decoder 122, a voltage generator 123, a control circuit 124, a page buffer circuit 125, a data input/output circuit 126, and a pass/failure checker 127.

The memory cell array 121 may include a plurality of memory cells. For example, the memory cell array 121 may include a plurality of memory cells arranged along a row direction and a column direction. Each of the memory cells may store one or more bits.

The address decoder 122 may be connected to the memory cell array 121 through word lines WL, string selection lines SSL, and ground selection lines GSL. The address decoder 122 may decode an address ADDR from the memory controller 110. The address decoder 122 may select at least one of the word lines WL based on the decoded address ADDR, may drive the at least one word line thus selected, and may control a voltage of the selected word line.

The voltage generator 123 may generate various voltages required for the nonvolatile memory device 120 to operate. For example, the voltage generator 123 may generate a plurality of program voltages, a plurality of pass voltages, a plurality of verification voltages, a plurality of selection read voltages, a plurality of non-selection read voltages, a plurality of erase voltages, and the like.

The control circuit 124 may control the address decoder 122, the voltage generator 123, the page buffer circuit 125, the input/output circuit 126, and the pass/failure checker 127 in response to a command CMD and a control signal CTRL from the external device.

The page buffer circuit 125 may be connected to the memory cell array 121 through a plurality of bit lines BL and may be connected to the input/output circuit 126 through a plurality of data lines DL. Under control of the control circuit 124, the page buffer circuit 125 may control the bit lines BL such that data from the input/output circuit 126 through the data lines is stored in the memory cell array 121. The page buffer circuit 125 may read data stored in the memory cell array 121 under control of the control circuit 124.

In example embodiments, the page buffer circuit 125 may store a result of a verification read operation about memory cells connected to a selected word line. The page buffer circuit 125 may output the result of the verification read operation as a page buffer signal PBS.

In example embodiments, the page buffer circuit 125 may have a multi-stage arrangement. For example, the page buffer circuit 125 may include a plurality of stages, each of which includes a plurality of page buffers. The page buffers may be respectively connected to the bit lines BL. Each of the page buffers may store a result of a verification read operation relating to each of the memory cells connected to a selected word line.

The page buffer circuit 125 may output a result of a verification read operation, stored in page buffers of each stage, as the page buffer signal PBS in response to a transfer signal TF from the control circuit 124. For example, the page buffer circuit 125 may output values (e.g., a result of a verification read operation), stored in page buffers of a first stage, as the page buffer signal PBS in response to the transfer signal TF from the control circuit 124. Afterwards, the page buffer circuit 125 may output values (e.g., a result of a verification read operation), stored in page buffers of a second stage, as the page buffer signal PBS in response to the transfer signal TF from the control circuit 124. That is, with regard to one verification read operation, the page buffer circuit 125 may sequentially or non-sequentially output the page buffer signal PBS several times, based on the transfer signal TF from the control circuit 124 or a plurality of stages.

The data input/output circuit 126 may be connected to the page buffer circuit 125 through the data lines DL. The input/output circuit 126 may transfer data, received from the memory controller 110, to the page buffer circuit 125 under control of the control circuit 124. Under control of the control circuit 124, the input/output circuit 126 may transfer data, received from the page buffer circuit 125, to the memory controller 110 in synchronization with a control signal CTRL.

The pass/failure (P/F) checker 127 may count a failure bit based on a page buffer signal PBS from the page buffer circuit 125. In example embodiments, a failure bit may indicate the number of memory cells, not programmed to a target program state, from among memory cells connected to a selected word line.

The P/F checker 127 may compare the counted failure bit and a reference value and may output a pass signal PASS or a failure signal FAIL based on a result of the comparison. For example, in the case where the counted failure bit is greater than the reference value, the P/F checker 127 may transfer to the control circuit 124 the failure signal FAIL indicating program fail. In this case, the control circuit 124 may further perform a following program operation, a next program loop, or a verification read operation of a next program loop in response to the failure signal FAIL.

In example embodiments, as described above, the page buffer circuit 125 may include a plurality of stages and may output a page buffer signal PBS several times with respect to the stages. At this time, the P/F checker 127 may perform failure bit counting operation with respect to each of page buffer signals PBS received several times and may accumulate the failure bit counting result to generate the number of accumulated failure bits.

The P/F checker 127 according to example embodiments may change the reference value with respect to each stage whenever the number of accumulated failure bits is generated. For example, the P/F checker 127 may determine program pass or failure by comparing a first reference value and the number of cumulative failure bits generated based on the page buffer signals PBS about first and second stages. The P/F checker 127 may determine program pass or failure by comparing a second reference value and the number of cumulative failure bits generated based on the page buffer signals PBS about first to fourth stages. In example embodiments, the second reference value may be larger than the first reference value, e.g., the reference value may decrease as the number of stages counted decreases.

In example embodiments, the first and second reference values may be determined based on the number of counted stages. For example, the reference value may decrease as the number of counted stages decreases, and thus program failure may be determined in advance. As a result, overhead according to a failure bit counting operation may be reduced. In example embodiments, the number of counted stages may be provided from the control circuit 124 as transfer information TFI. The P/F checker 127 may change a reference value based on the transfer information TFI from the control circuit 124. In example embodiments, the transfer information TFI may include information about the number of activated stages from among the plurality of stages of the page buffer circuit 125. Alternatively, the transfer information TFI may include the transfer signal TF.

Figure 3:
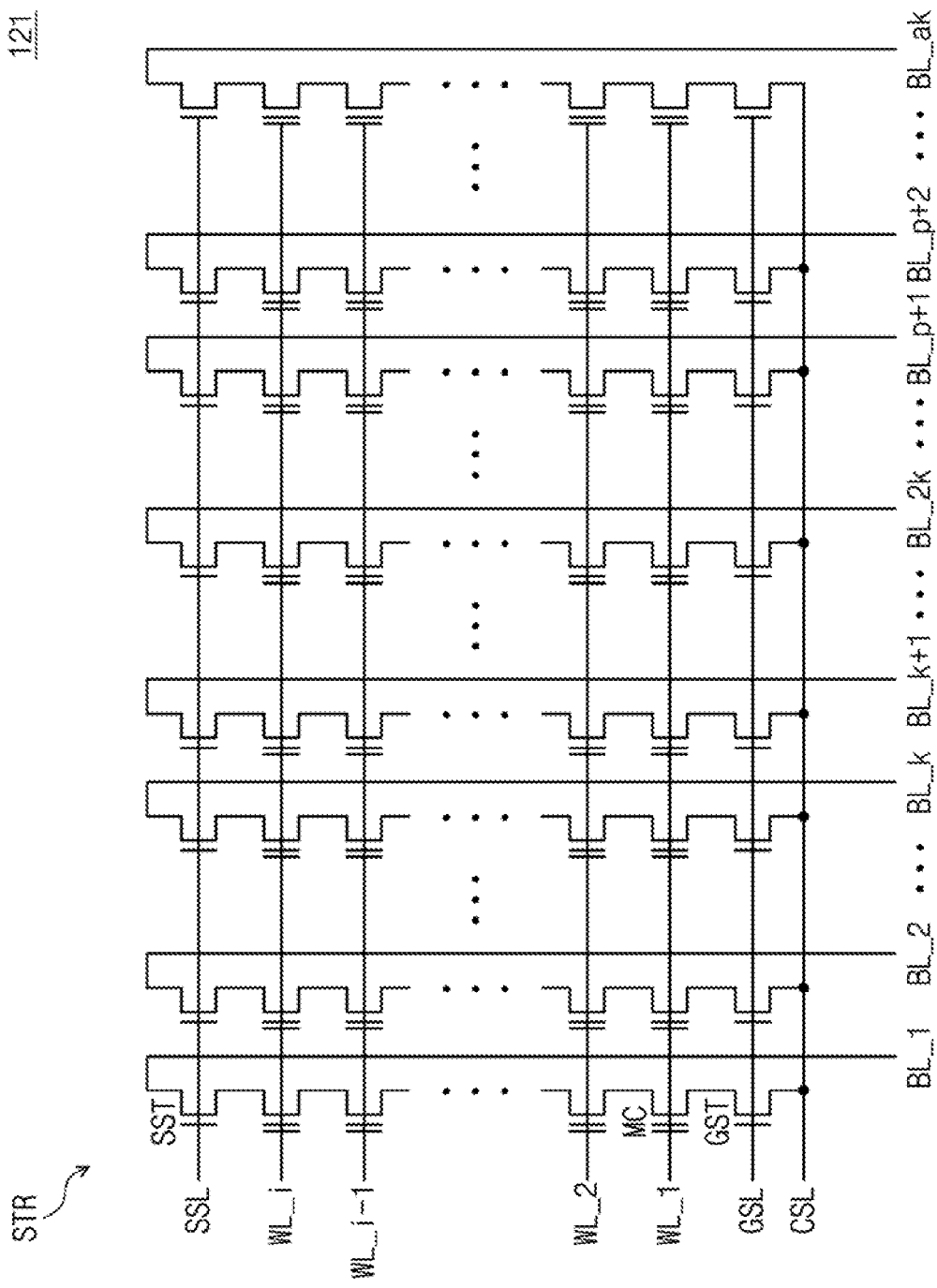
FIG. 3 illustrates an embodiment of a memory cell array.
Figure 4:
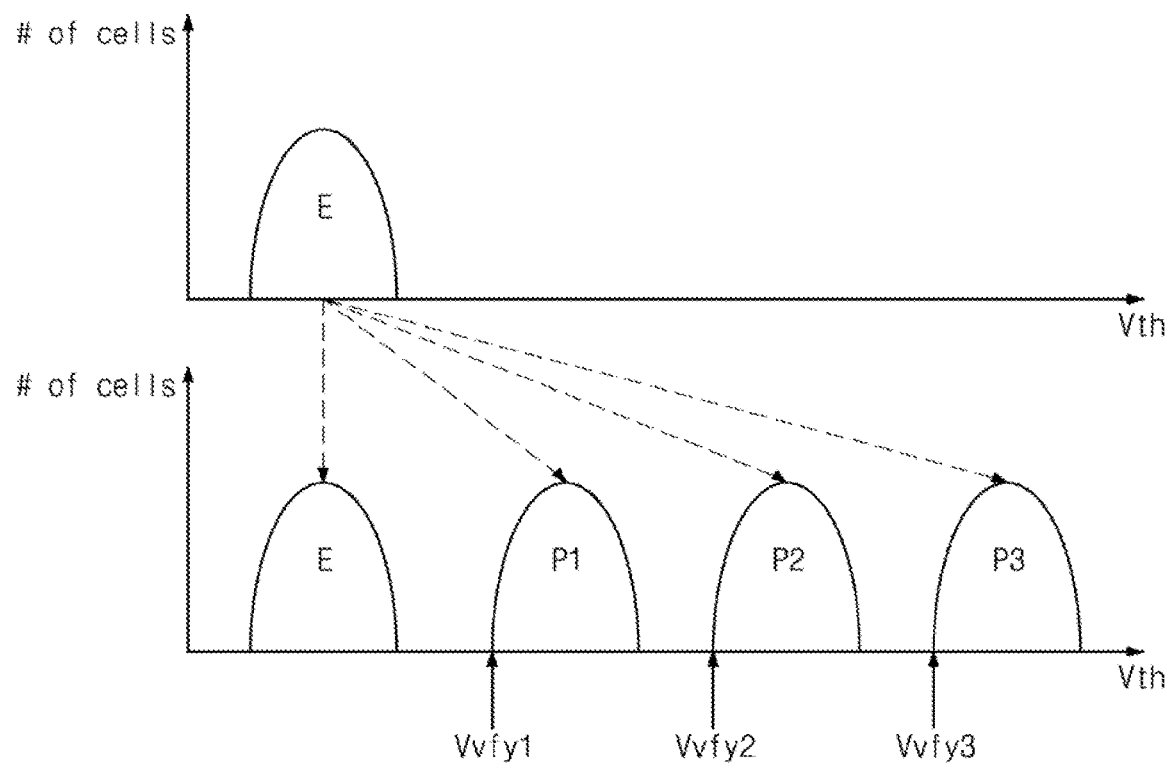
FIG. 4 illustrates an example of a threshold voltage distribution of memory cells and a program operation for the memory cells.
Figure 4:
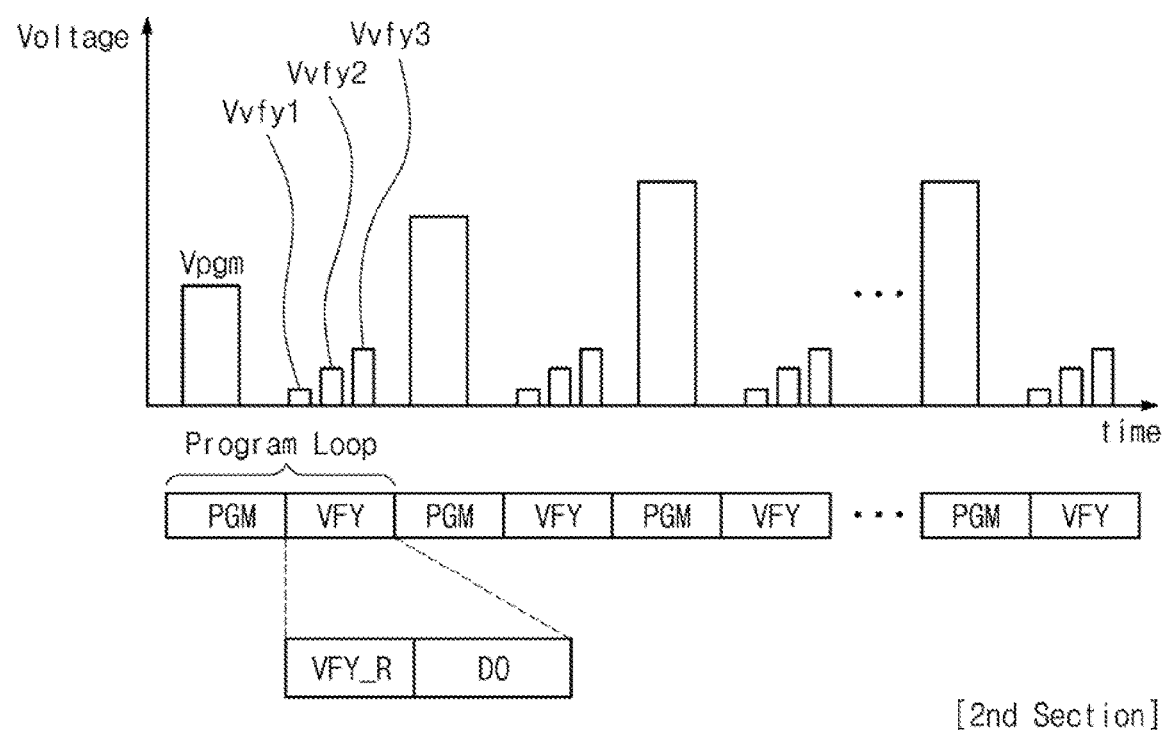

FIG. 3 illustrating an embodiment of the memory cell array 121, and FIG. 4 illustrates an example of a threshold voltage distribution of memory cells in the memory cell array 121 and a program operation relating to the memory cells.

Referring to FIGS. 2 and 3, the memory cell array 121 may include a plurality of cell strings STR. Each cell string STR may include a string selection transistor SST, a plurality of memory cells MC, and a ground selection transistor GST. In the cell strings STR, the string selection transistors SST may be connected to a string selection line SSL. The memory cells MC may be connected to a plurality of word lines WL_1 to WL_i, respectively. In the cell strings STR, the ground selection transistors GST may be connected to a ground selection line GSL.

In each cell string STR, the memory cells may be connected serially to each other. In each cell string STR, the string selection transistor SST may be between the serially connected memory cells MC and a bit line (e.g., BL_1) corresponding to each cell string STR. In each cell string STR, the ground selection transistor GST may be between the serially connected memory cells MC and a common source line CSL.

During a program operation of the nonvolatile memory device 120, at least one of the word lines WL_1 to WL_i may be selected, and memory cells connected to the selected word line may be programmed by the page or by the word line.

Referring to FIGS. 2 to 4, the memory cells of the memory cell array 121 may have one of an erase state E or first to third program states P1 to P3. In example embodiments, each of the memory cells having the erase state E may be programmed to have one of the erase state E or the first to third program states P1 to P3.

As described above, the nonvolatile memory device 120 may program memory cells based on the ISPP scheme. For example, as illustrated at a second section of FIG. 4, the nonvolatile memory device 120 may program memory cells by performing a plurality of program loops. Each program loop may include a program step in which a program voltage Vpgm is applied to a selected word line and a verification step VFY in which program states of memory cells are verified.

The program voltage Vpgm, which is applied to the selected word line in the program step PGM, may be increased by a predetermined level whenever the program loop is repeated. The verification step VFY may include a verification read operation VFY_R and a determination operation DO.

The verification read operation VFY_R may indicate an operation to read memory cells based on first to third verification voltages Vvfy1 to Vvfy3. For example, memory cells of which the target program state is a first program state P1 may be read using the first verification voltage Vvfy1. Memory cells of which the target program state is the first program state P1 and which is not yet programmed to the first program state P1 may be read as an ON cell when the first verification voltage Vvfy1 is used. Memory cells of which the target program state is the first program state P1 and which is programmed to the first program state P1 may be read as an OFF cell when the first verification voltage Vvfy1 is used. For example, memory cells which are read as the ON cell using the first verification voltage Vvfy1 may be program-failure cells, and memory cells which are read as an OFF cell using the first verification voltage Vvfy1 may be program-pass cells.

Memory cells having a target program state of the second or third program state P2 or P3 may be also verified using the second or third verification voltage Vvfy2 or Vvfy3, similar to the above description.

As described above, the page buffer circuit 125 may output a result of a verification read operation through the page buffer signal PBS in response to a transfer signal TF from the control circuit 124. During the determination operation DO of the verification step VFY, the P/F checker 127 may count a failure bit based on the page buffer signal PBS.

At this time, the P/F checker 127 may perform failure bit counting operation with respect to each of page buffer signals PBS received several times and may generate a number of accumulated failure bits. The P/F checker 127 may determine program pass or program failure by comparing the number of cumulative failure bits with each of a plurality of reference values.

For example, during the determination operation DO, the P/F checker 127 may receive a page buffer signal PBS corresponding to a first stage and may count a first number of failure bits based on the received page buffer signal PBS. Program failure or program pass may be determined by comparing the first number of failure bits and the first reference value. In the case where the first number of failure bits is less than the first reference value, the P/F checker 127 may receive a page buffer signal PBS corresponding to a second stage and may count a second number of failure bits based on the received page buffer signal PBS. The P/F checker 127 may determine program failure or program pass by comparing the accumulated number of the first and second numbers of failure bits and the second reference value.

In the case where the program failure is determined during the determination operation DO, the P/F checker 127 may send a failure signal FAILURE to the control circuit 124 such that the determination operation DO or a counting operation about remaining stages is terminated. The control circuit 124 may perform a next program loop or a verification step of the next program loop in response to the failure signal FAIL.

In example embodiments, whether to perform a following program loop may be determined according to a result of the determination operation DO. For example, whether to perform a second program step of a second program loop may be determined after a first determination operation of the first verification step in the first program loop is completed.

In example embodiments, the determination operation DO may be performed together with a program step of a next program loop. For example, the first determination operation DO of the first verification step in the first program loop may be performed together with a second program step of a second program loop.

Figure 5:
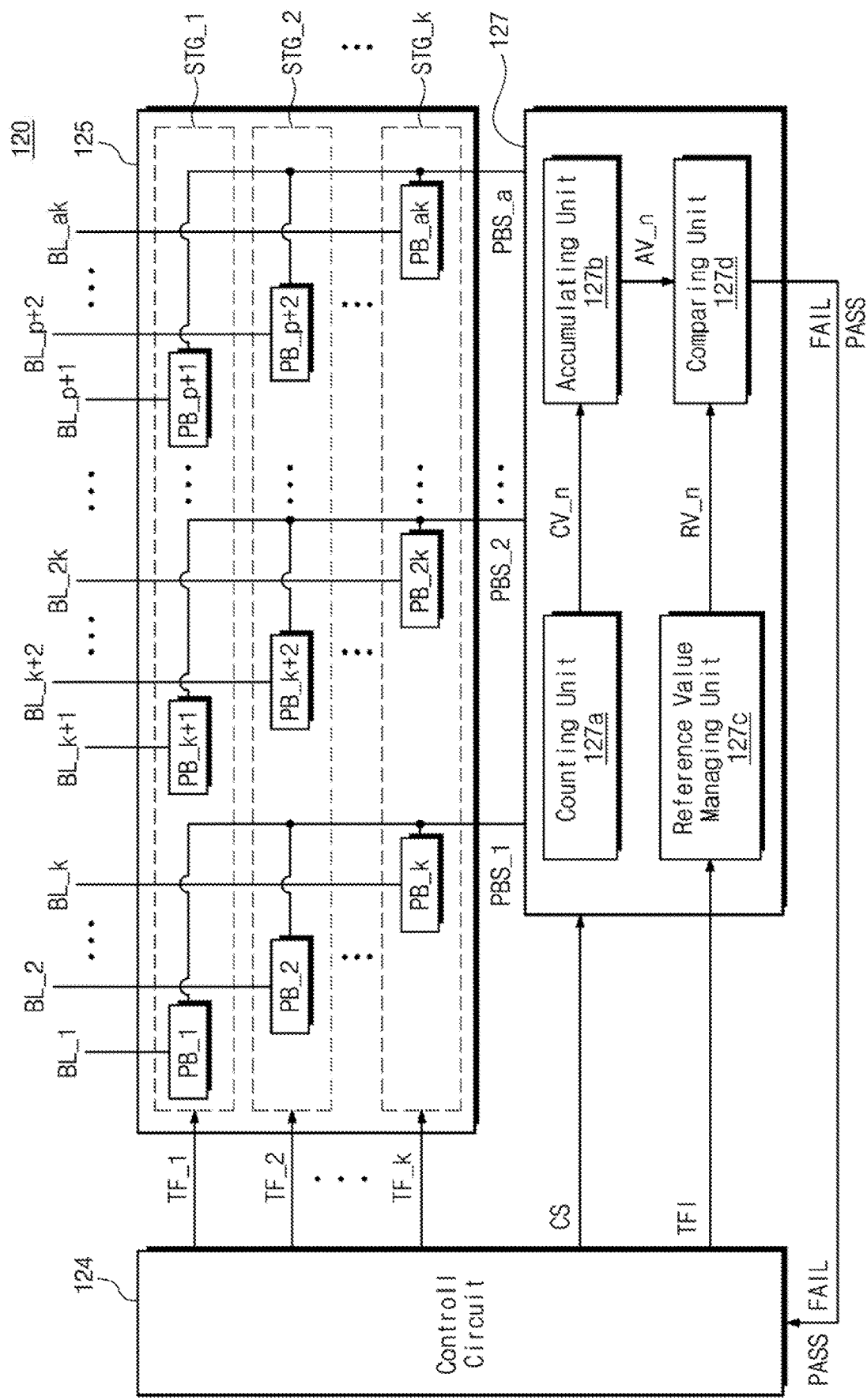
FIG. 5 illustrates another embodiment of a nonvolatile memory device.

FIG. 5 illustrates an embodiment of a nonvolatile memory device 120 in FIG. 2. In example embodiments, a P/F checker 127 and an operating method thereof will be described with reference to FIG. 5. Function blocks in FIG. 5 may be examples and may be different in another embodiment.

Furthermore, it may be assumed that the nonvolatile memory device 120 programs selected memory cells by performing a plurality of program loops. In example embodiments, each program loop may include a program step in which a program voltage is applied to a selected word line and a verification step in which program states of the selected memory cells are verified. In each program loop, the verification step may include a verification read operation to read the selected memory cells using at least one verification voltage and a determination operation to determine program pass or program failure based on a result of the verification read operation.

Furthermore, a counting operation to be described below may indicate an operation to count a failure bit based on a page buffer signal set PBS_s from the page buffer circuit 125. For example, during a determination operation DO, the P/F checker 127 may receive page buffer signal sets PBS_s from the page buffer circuit 125 several times and may perform a counting operation several times.

Also, a counting operation about a specific stage to be described below may be an operation in which a counted value is generated by counting the number of memory cells (e.g., a failure bit), of which the program operation is not completed, from among memory cells connected to page buffers in a specific stage based on a page buffer signal set corresponding to the specific stage.

Furthermore, it may be assumed that a counted value CV to be disclosed below indicates the number of memory cells for which the program operation is not completed, from among memory cells corresponding to or connected to page buffers in one stage (e.g., a first stage STG_1), or the number of memory cells for which the program operation is not completed from among memory cells, each having a target program state, of memory cells connected to or corresponding to page buffers in one stage (e.g., a first stage STG_1). In other words, it may be assumed that the counted value CV indicates a failure bit about a specific stage.

Furthermore, it may be assumed that an accumulated value AV to be described below indicates an accumulated counted value at a counting operation of a verification step in a program loop. For example, in the case where the P/F checker 127 performs a counting operation about each of first to third stages STG_1 to STG_3 to generate first to third counted values CV_1 to CV_3, a first accumulated value AV_1 may be the first counted value CV_1, a second accumulated value AV_2 is a sum of the first and second counted values CV_1 and CV_2, and a third accumulated value AV_3 is a sum of the first to third counted values CV_1 to CV_3.

Referring to FIG. 5, the page buffer circuit 125 may include a plurality of stages STG_1 to STG_k. The stages STG_1, STG_2, . . . , STG_k may include a plurality of page buffers (PB_1~BL_k), (PB_k+1~PB_2k), . . . , (PB_p+1~PB_ak), respectively. The page buffers (PB_1~BL_k), (PB_k+1~PB_2k), . . . , (PB_p+1~PB_ak) may be respectively connected to a plurality of bit lines (BL_1~BL_k), (BL_k+1~BL_2k), . . . , (BL_p+1~BL_ak).

In example embodiments, each of the stages STG_1 to STG_k may include the same number of page buffers. In each of the stages STG_1 to STG_k, page buffers PB may be connected to each other. For example, in each of the stages STG_1 to STG_k, page buffers (e.g., PB_1 to PB_k) may be connected to a wired-OR structure and may output first page buffer signals PBS_1 in response to corresponding transfer signals TF_1 to TF_k, respectively. Likewise, in each of the stages STG_1 to STG_k, page buffers (e.g., PB_k+1 to PB_2k) may be connected to a wired-OR structure and may output second page buffer signals PBS_2 in response to corresponding transfer signals TF_1 to TF_k, respectively.

Each of the page buffers PB_1 to PB_k, PB_k+1 to PB_2k, . . . , PB_p+1 to PB_ak may store a result of a verification read operation about a corresponding one of memory cells connected to a selected word line. For example, in the case where a result of a verification read operation about a memory cell, directly or indirectly connected to a first bit line BL_1, from among memory cells connected to the selected word line indicates program failure, the page buffer PB_1 connected to the first bit line BL_1 may store a logical value of logic low. In the case where a result of a verification read operation about a memory cell, directly or indirectly connected to a second bit line BL_2, from among memory cells connected to the selected word line indicates program pass, the page buffer PB_2 connected to the second bit line BL_2 may store a logical value of logic high.

The page buffer circuit 125 may output values stored in page buffers PB as page buffer signals PBS_1 to PBS_a in response to a transfer signal TF from the control circuit 124. For example, the control circuit 124 may sequentially or non-sequentially transfer first to k-th transfer signals TF_1 to TF_k to the page buffer circuit 125. The page buffer circuit 125 may respectively activate the first to k-th stages STG_1 to STG_k in response to the first to k-th transfer signals TF_1 to TF_k to output the page buffer signals PBS_1 to PBS_a.

For example, the page buffer circuit 125 may output values stored in page buffers PB_1, PB_k+1, . . . , PB_p+1 as page buffer signals PBS_1, PBS_2, . . . , PBS_a in response to the first transfer signal TF_1 from the control circuit 124. The page buffer circuit 125 may output values stored in page buffers PB_1, PB_k+1, . . . , PB_p+1 as page buffer signals PBS_1, PBS_2, . . . , PBS_a in response to the first transfer signal TF_1 from the control circuit 124. That is, during a determination operation DO of a verification step VFY in a program loop, the page buffer circuit 125 may output page buffer signals PBS_1 to PBS_a several times in response to the transfer signals TF_1 to TF_k of the control circuit 124.

At this time, the page buffer signals PBS_1 to PBS_a may be output for each of the stages STG_1 to STG_k. For descriptive convenience, page buffer signals corresponding to each stage may be referred as to a page buffer signal set.

That is, the page buffer circuit 125 may output values stored in page buffers PB in the first stage STG_1 as a first page buffer signal set PBS_s1 in response to the first transfer signal TF_1 from the control circuit 124 and may output values stored in page buffers PB in the second stage STG_2 as a second page buffer signal set PBS_s2 in response to the second transfer signal TF_2 therefrom.

For descriptive convenience, it may be assumed that the control circuit 124 outputs the first to k-th transfer signals TF_1 to TF_k such that first to k-th page buffer signal sets PBS_s1 to PBS_sk of the first to k-th stages STG_1 to STG_k are sequentially output. However, the order of the first to k-th transfer signals TF_1 to TF_k output from the control circuit 124 may be different in another embodiment. For example, the control circuit 124 may output the first to k-th transfer signals TF_1 to TF_k such that first to k-th page buffer signal sets PBS_s1 to PBS_sk of the first to k-th stages STG_1 to STG_k are non-sequentially output. In example embodiments, each of the first to k-th page buffer signal sets PBS_s1 to PBS_sk may include first to a-th page buffer signals PBS_1 to PBS_a from separated page buffers.

The P/F checker 127 may receive page buffer signal PBS_1 to PBS_a from the page buffer circuit 125. The P/F checker 127 may receive a control signal CS and transmission information TFI from the control circuit 124. The P/F checker 127 may determine program pass or failure based on received signals and may provide a pass signal PASS or a failure signal FAIL to the control circuit 124 as the determination result. In example embodiments, the transmission information TFI may include the transmission signals TF_1 to TF_k of information on them.

The P/F checker 127 may include a counting unit 127a, an accumulating unit 127b, a reference value managing unit 127c, and a comparing unit 127d. The counting unit 127a may count a failure bit with respect to page buffer signals PBS_1 to PBS_a from the page buffer circuit 125, in response to the control signal CS from the control circuit 124.

For example, the page buffer circuit 125 may output a first page buffer signal set PBS_s1 in response to the first transmission signal TF_1. In example embodiments, the first page buffer signal set PBS_s1 may include page buffer signals PBS_1 to PBS_a from page buffers PB_1, PB_k+1, . . . , PB+p+1 in a first stage STG_1. The counting unit 127a of the P/F checker 127 may count a failure bit with respect to page buffer signals PBS_1 to PBS_a in the first page buffer signal set PBS_s1 and may generate a first counted value CV_1.

Likewise, the page buffer circuit 125 may output a second page buffer signal set PBS_s2 in response to the second transmission signal TF_2. In example embodiments, the second page buffer signal set PBS_s2 may include page buffer signals PBS_1 to PBS_a from page buffers PB_2, PB_k+2, . . . , PB+p+2 in a second stage STG_2. The counting unit 127a of the P/F checker 127 may count a failure bit with respect to page buffer signals PBS_1 to PBS_a in the second page buffer signal set PBS_s2 and may generate a second counted value CV_2.

Thus, the counting unit 127a may generate a plurality of counted values CV_n (n being a natural number) based on the page buffer signal sets PBS_s1 to PBS_sk. Each of the counted values CV_n may be provided to the accumulating unit 127b.

The accumulating unit 127b may accumulate the counted values CV_n from the counting unit 127a and may generate an accumulated value AV_n. For example, the accumulating unit 127b may generate a first accumulated value AV_1 based on a first counted value CV_1. Afterwards, the accumulating unit 127b may receive a second counted value CV_2 from the counting unit 127a and may sum the second counted value CV_2 and the first accumulated value AV_1 to generate a second accumulated value AV_2. Likewise, the accumulating unit 127b may sequentially accumulate counted values CV_n from the counting unit 127a to generate the accumulated value AV_n.

The reference value managing unit 127c may generate a plurality of reference values RV_n based on the transmission information TFI from the control circuit 124. In example embodiments, the transmission information TFI may include information on the number of stages which are activated during a determination operation DO of a verification step VFY in one program loop. For example, during the determination operation DO, in the case where the first stage STG_1 is activated and thus the first page buffer signal set PBS_s1 is output, the reference value managing unit 127c may output the first reference value RV_1; in the case where the first to fourth stages STG_1 to STG_4 are activated and thus the first to fourth page buffer signal sets PBS_s1 to PBS_s4 are output, the reference value managing unit 127c may output the fourth reference value RV_4. For example, the reference value managing unit 127c may generate a reference value which varies according to the number of stages activated or the number of page buffer signal sets. In example embodiments, as the number of activated stages is larger, a corresponding reference value RV_n may be larger.

In example embodiments, the reference value managing unit 127c may include a representative reference value which is previously determined based on at least one of the error correction ability of the ECC 111, a read margin, the number of bits stored in a cell, or a target program state. Each of reference values RV_n which are generated based on the transmission information TFI may be determined based on the representative reference value. In example embodiments, the reference values RV_n may be proportional to the representative reference value.

The comparing unit 127d may receive the accumulated value AV_n from the accumulating unit 127b and the reference value RV_n from the reference value managing unit 127c, may compare the accumulated value AV_n and the reference value RV_n, and may output a pass signal PASS or a failure signal FAIL as the comparison result.

For example, in the case where the first to fourth page buffer signal sets PBS_s1 to PBS_s4 are respectively output as the first to fourth stages STG_1 to STG_4 are respectively activated by the transmission information TF from the control circuit 124, the accumulating unit 127b may output a fourth accumulated value AV_4 as a result of accumulating the first to fourth counted values CV_1 to CV_4, and the reference value managing unit 127c may generate the fourth reference value RV_4 in response to the transmission information TFI from the control circuit 124. The comparing unit 127d may compare the fourth accumulated value AV_4 and the fourth reference value RV_4. In the case where the fourth accumulated value AV_4 is greater than or equal to the fourth reference value RV_4, the comparing unit 127d may determine a program operation of a current program loop as being program failure. In the case where the fourth accumulated value AV_4 is smaller than the fourth reference value RV_4, the P/F checker 127 may continue to perform a counting operation or a determination operation about remaining stages to determine program pass or program failure.

In the case of the program failure, the comparing unit 127d may output the failure signal FAILURE to the control circuit 124, and the control circuit 124 may control the page buffer circuit 125 and the P/F checker 127 such that a counting operation about remaining stages is not performed. In example embodiments, the control circuit 124 may perform a next program loop or a verification step of the next program loop in response to the failure signal FAIL.

According to example embodiments, during the determination operation DO for determining program pass or failure, a reference value may be changed according to a activated stage from among stages of the page buffer circuit 125. Thus, program failure may be determined in advance before a counting operation about all stages is performed.

For example, to determine program pass or failure, one type of P/F checker may generate a final accumulated value through a failure bit counting operation performed with respect to all stages of a page buffer circuit and may compare the final accumulated value and a representative reference value (e.g., a predetermined value or a specific value). However, the P/F checker 127 according to example embodiments may change a reference value based on an activated stage to determine program failure in advance, thereby reducing overhead due to a counting operation.

For example, it may be assumed that the page buffer circuit 125 includes first to eighth stages STG_1 to STG_8 and a representative reference value is a 128-bit value. With this assumption, one type of P/F checker may count a failure bit with respect to all the first to eighth stages to generate a final accumulated value, and this P/F checker may compare the final accumulated value and a 128-bit value being a representative reference value to determine program pass or failure. However, the P/F checker 127 according to an embodiment may respectively compare first to eighth accumulated values AV_1 to AV_8 about the first to eighth stages STG_1 to STG_8 with first to eighth reference values RV_1 to RV_8 to determine program pass or program failure.

In this case, each of the first to eighth reference values RV_1 to RV_8 may be proportional to a 128-bit value that corresponds to the representative reference value. For example, the first reference value RV_1 may be a 16-bit value (128 bits*1/8) corresponding to a comparison target about an accumulated value of one stage (e.g., the first stage STG_1). Likewise, the second reference value RV_2 may be a 32-bit value (128 bits*2/8) corresponding to a comparison target about an accumulated value of two stages (e.g., the first and second stages STG_1 and STG_2). Program failure may occur if the second accumulated value AV_2 is greater than the second reference value RV_2, that is, a 32-bit value. In this case, a failure bit counting operation about third to eighth stages STG_3 to STG_8 may be skipped.

As described above, a reference value may be changed according to the number of activated stages, and thus program failure may be determined in advance. Since overhead due to the failure bit counting operation is reduced, the program performance of the nonvolatile memory device may be improved.

In example embodiments, each page buffer PB may include at least one latch and a transmission transistor. The at least one latch in each page buffer may be a sense latch, a data latch, a cache latch, or the like. The transmission transistor may output information, stored in the at least one latch, as a page buffer signal PBS in response to transmission signals TF from the control circuit 124. The page buffer may have a different structure in another embodiment.

Each of the counting unit 127*a*, the accumulating unit 127*b*, the reference value managing unit 127*c*, and the comparing unit 127*d* may be implemented, for example, by an analog circuit, a digital circuit, or a combination of the analog and digital circuits. The P/F checker 127 may have a different structure in another embodiment.

Figure 6:
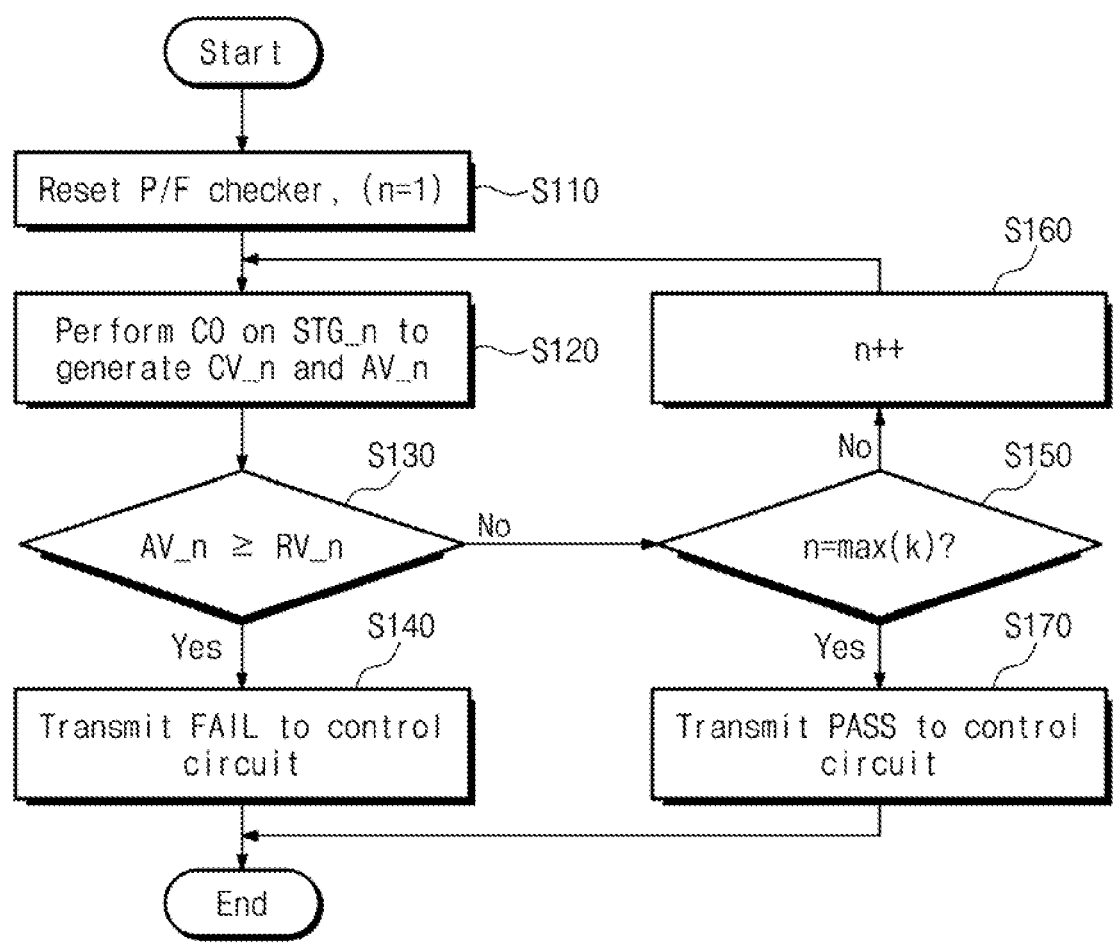
FIG. 6 illustrates an embodiment an operation of a pass/failure (P/F) checker.

FIG. 6 illustrates an example of an operation of the pass/failure checker in FIG. 5. In example embodiments, an operating method according to a flow chart of FIG. 6 may correspond to a determination operation DO for determining program pass or fail. In example embodiments, a determination operation DO may include a plurality of counting operations.

Referring to FIGS. 5 and 6, in operation S110, the P/F checker 127 may be reset and a variable n may be set to '1'. For example, resetting of the P/F checker 127 and setting of the variable n may be made based on the control signal CS from the control circuit 124.

In operation S120, the P/F checker 127 may count a failure bit of an n-th stage STG_n to generate an n-th accumulated value AV_n. For example, as described above, the page buffer circuit 125 may activate an n-th stage STG_n in response to an n-th transmission signal TF_n from the control circuit 124 and may output information of page buffers PB of the n-th stage STG_n as page buffer signals PBS (e.g., an n-th page buffer signal set PBS_sn). The P/F checker 127 may generate an n-th counted value CV_n by counting a failure bit of the n-th stage STG_n based on the n-th page buffer signal set PBS_sn and may generate an n-th accumulated value AV_n based on the counted value CV_n thus generated. In example embodiments, in the case where a previously counted stage does not exist, the n-th counted value CV_n may be the same as the n-th accumulated value AV_n.

In operation S130, the P/F checker 127 may compare the n-th accumulated value AV_n and an n-th reference value RV_n. For example, as described above, the reference value managing unit 127*c* of the P/F checker 127 may output the n-th reference value RV_n based on the transmission information TFI from the control circuit 124. As described above, the n-th reference value RV_n may be a value which is based on the number of counted or activated stages.

In the case where the n-th accumulated value AV_n is greater than or equal to the n-th reference value RV_n, in operation S140, the P/F checker 127 may determine a program operation of a current program loop as being program failure and may output a failure signal FAIL to the control circuit 124. In example embodiments, in the case of the program failure, the determination operation DO may be terminated, and a next program loop may be performed by the control circuit 124.

In the case where the n-th accumulated value AV_n is less than the n-th reference value RV_n, in operation S150, whether the variable n is the same as a maximum value (e.g., k being natural number) may be determined. Thus, whether a counting operation is performed with respect to all stages STG_1 to STG_k of the page buffer circuit 125 may be determined. In the case where the variable n is not the same as the maximum value, in operation S160, the variable n may increase by one and the procedure may proceed to operation S120.

In the case where the variable n is the same as the maximum value, in operation S170, the P/F checker 127 may determine a program operation of a current program loop as being program pass and may output a pass signal PASS to the control circuit 124. In example embodiments, the control circuit 124 may terminate the program operation in response to the pass signal PASS or may perform program loops for other target program states.

Figure 7:
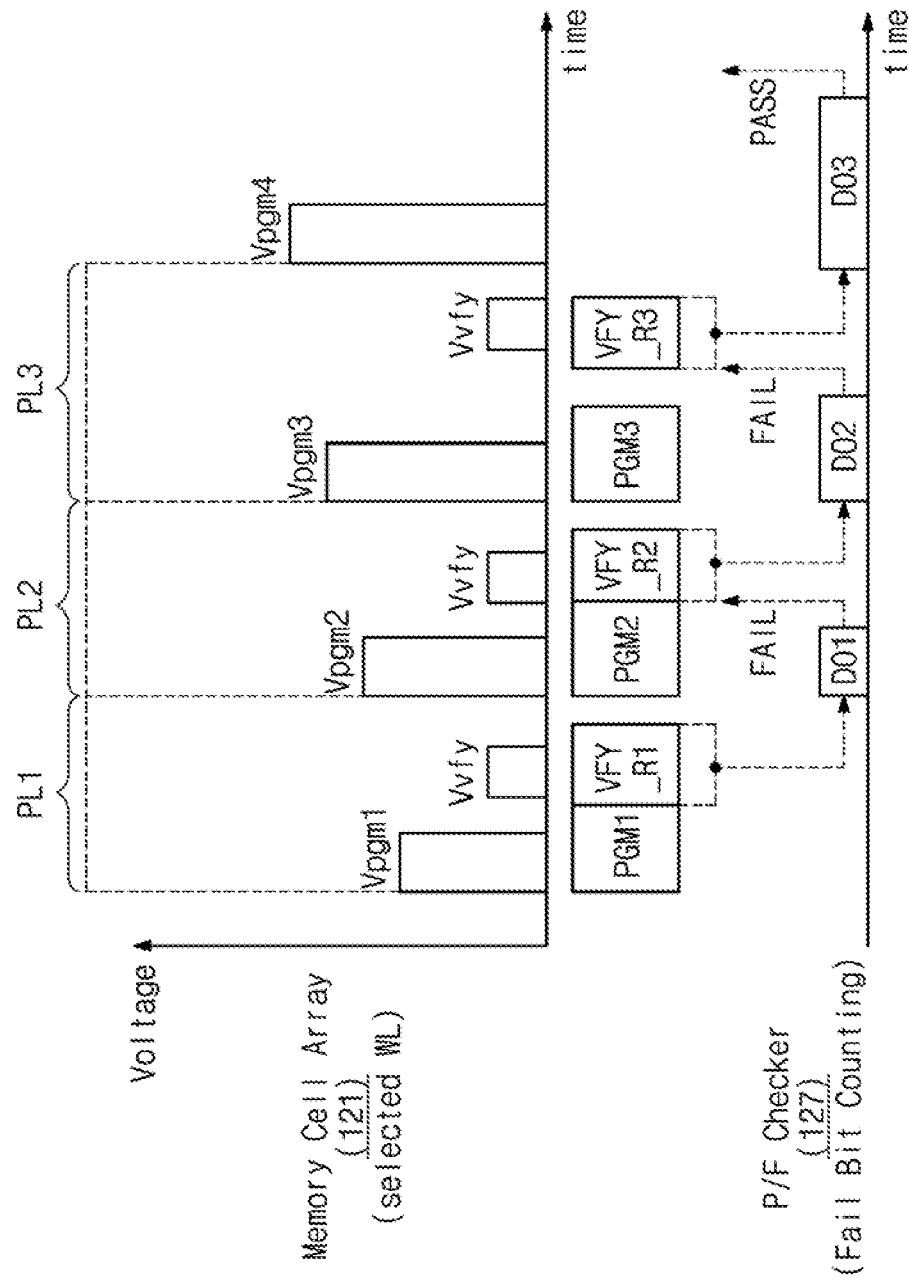
FIG. 7 illustrates an embodiment of an operating method of FIG. 6.

FIG. 7 illustrates an embodiment of an operating method of FIG. 6. In example embodiments, FIG. 7 is a timing diagram illustrating an operation of a P/F checker 127 and a word line voltage applied to a memory cell array 121 (e.g., a selected word line) during a program operation of the nonvolatile memory device 120.

For descriptive convenience and brevity of illustration, it may be assumed that each of program loops includes a program step PGM and a verification step VFY and the verification step VFY may include a verification read operation VFY_R and a determination operation DO. It may be assumed that the determination operation DO is performed together with a program step of a next program loop. In one embodiment, a program step of a next program loop may be performed according to a result of the determination operation DO. In one embodiment, the determination operation DO and a program step or a verification read operation of a next program loop may be performed in parallel (or to be overlapped), and a determination operation of the next program loop may be performed according to a result of the determination operation about a previous program loop.

Furthermore, for brevity of illustration, a verification read operation is exemplified as a read voltage Vvfy is applied once. In one embodiment, a plurality of verification voltages may be applied according to target program states, the number of bits stored in a memory cell, or a type of a memory cell during the verification read operation. In addition, it may be assumed that the page buffer circuit 125 includes first to eighth stages STG_1 to STG_8 and the P/F checker 127 generates a counted value and an accumulated value with respect to each of the first to eighth stages STG_1 to STG_8.

Referring to FIGS. 5 and 7, as described above, the nonvolatile memory device 120 may program memory cells connected to a selected word line based on the ISPP scheme. For example, the ISPP scheme is described with reference to FIG. 4.

The P/F checker 127 may perform a determination operation DO based on a result of a verification read operation VFY_R. As described above, the P/F checker 127 may count a failure bit based on page buffer signal sets PBS_s1 to PBS_sk about the stages STG_1 to STG_k received from the page buffer circuit 125.

For example, a program voltage Vpgm1 may be applied to a selected word line in a first program step PGM1 of a first program loop PL1. Performed in a verification step of the first program loop PL1 is a first verification read operation VFY_R1 in which a verification voltage Vvfy is applied to the selected word line to read selected memory cells. The P/F checker 127 may determine program pass or program failure by performing a first determination operation DO1 based on a result of the first verification read operation VFY_R1.

At this time, the P/F checker 127 may determine program pass or program failure based on a method described with reference to FIGS. 5 and 6. Thus, the P/F checker 127 may determine program pass or program failure by generating accumulated values about the stages STG_1 to STG_k of the page buffer circuit 125 and comparing the accumulated values and different reference values, respectively. In example embodiments, in the case where a result of comparing an accumulated value about a specific stage and a reference value corresponding thereto indicates program pass, counting operations about remaining stages may be skipped.

As illustrated in FIG. 7, in the case where a result of the first determination operation DO1 indicates program failure, a second verification read operation VFY_R2 of a second program loop PL2 may be performed. A second determination operation DO2 may be performed according to a result of the second verification read operation VFY_R2 of the second program loop PL2. Likewise, the P/F checker 127 may perform the second determination operation DO2 to determine program pass or program failure. In the case where a result of the second determination operation DO2 indicates program failure, a third verification read operation VFY_R3 of a third program loop PL3 may be performed. The P/F checker 127 may perform a third determination operation DO3 based on a result of the third verification read operation VFY_R3 of the third program loop PL3 and may determine program pass or program failure based on a result of the third determination operation DO3. The following program loop(s) may not be performed in the case where the result of the third determination operation DO3 indicates program pass.

In example embodiments, times taken to perform the first to third determination operations DO1 to DO3 of the program loops PL1 to PL3 may be different from each other. For example, an execution time of the first determination operation DO1 may be shorter than that of the second determination operation DO2. This may mean that the number of stages to be counted during the first determination operation DO1 is less than the number of stages to be counted during the second determination operation DO2. Thus, since program pass or failure is determined by using a reference value variable according to an accumulated value about each stage, the P/F checker 127 may determine program failure in advance and counting operations about remaining stages may be skipped. Since overhead due to the counting operations is reduced during a determination operation DO, the program performance of the nonvolatile memory device may be improved.

Figure 8:
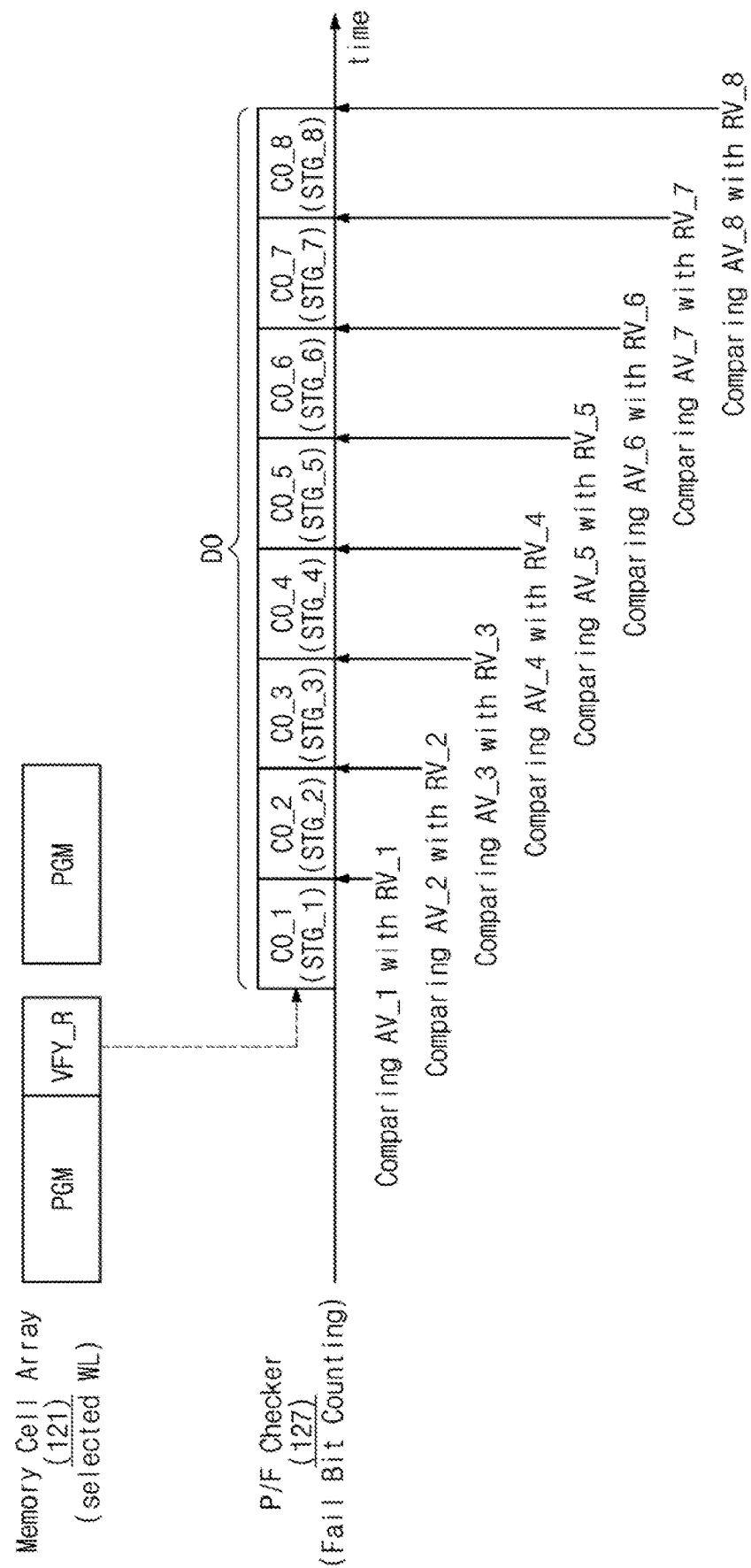
FIG. 8 illustrates an embodiment of a plurality of program loops.

FIG. 8 illustrates an embodiment of one of a plurality of program loops of FIG. 7. In FIG. 8, the X-axis corresponds to time. In example embodiments, for descriptive convenience, it may be assumed that the page buffer circuit 125 includes first to eighth stages STG1 to STG8 and the control circuit 124 outputs transmission signals TF such that the first to eighth stages STG1 to STG8 are sequentially activated. With this assumption, the P/F checker 127 may sequentially perform first to eighth counting operations CO_1 to CO_8 about the first to eighth stages STG_1 to STG_8 to generate first to eighth counted values CV_1 to CV_8 and first to eighth accumulated values AV_1 to AV_8 in sequence. In one embodiment, the page buffer circuit 125 may further include a plurality of stages, and the control circuit 124 may output the transmission signal TF such that the first to eighth stages STG_1 to STG_8 are sequentially output.

Referring to FIGS. 5, 7, and 8, the nonvolatile memory device 120 may perform a program step PGM in which the program voltage Vpgm is applied to a selected word line and a verification read operation VFY_R in which a verification voltage Vvfy is applied to the selected word line. The nonvolatile memory device 120 may perform a determination operation DO based on a result of the verification read operation VFY_R.

For example, as described above, the page buffer circuit 125 may include first to eighth stages STG_1 to STG_8 and may sequentially output page buffer signal sets PSB_s1 to PSB_s8 corresponding to the first to eighth stages STG_1 to STG_8 in response to the transmission signal TF from the control circuit 124. The page buffer signal sets PSB_s1 to PSB_s8 may be provided to the P/F checker 127. The P/F checker 127 may sequentially perform first to eighth counting operations CO_1 to CO_8 based on the first to eighth page buffer signal sets PSB_s1 to PSB_s8 sequentially received from the page buffer circuit 125 to generate first to eighth counted values CV_1 to CV_8 and first to eighth accumulated values AV_1 to AV_8 in sequence. The P/F checker 127 may respectively compare the first to eighth accumulated values AV_1 to AV_8 with first to eighth reference values RV_1 to RV_8 to determine program pass or failure.

First, for example, the P/F checker 127 may perform the first counting operation CO1 about the first stage STG_1 to generate the first counted value CV_1 and the first accumulated value AV_1. The P/F checker 127 may compare the first accumulated value AV_1 and the first reference value RV_1. The first reference value RV_1 may be generated by the reference value managing unit 127c based on the transmission information TFI from the control circuit 124.

Afterwards, the P/F checker 127 may perform the second counting operation CO2 about the second stage STG_2 to generate the second counted value CV_2 and the second accumulated value AV_2. The second accumulated value AV_2 may be a sum of the first accumulated value AV_1 and the second counted value CV_2. The P/F checker 127 may compare the second accumulated value AV_2 and the second reference value RV_2. The second reference value RV_2 may be generated by the reference value managing unit 127c based on the transmission information TFI.

Likewise, the P/F checker 127 may sequentially perform third to eighth counting operations CO_3 to CO_8 about the third to eighth stages STG_3 to STG_8 to generate third to eighth counted values CV_3 to CV_8 and third to eighth accumulated values AV_3 to AV_8 in sequence. In example embodiments, each of the third to eighth accumulated values AV_3 to AV_8 may be a sum of a corresponding counted value and a previous accumulated value. The P/F checker 127 may compare the third to eighth accumulated values AV_3 AV_8 and the third to eighth reference values RV_1 to RV_8, respectively. Each of the third to eighth reference values RV_3 to RV_8 may be generated by the reference value managing unit 127c based on the transmission information TFI.

In example embodiments, a program step of a next program loop may be performed together during the determination operation DO of the P/F checker 127. Thus, the program voltage Vpgm may be applied to the selected word line during the determination operation DO of the P/F checker 127.

As described above, the P/F checker 127 according to example embodiments may change a reference value based on a counted or activated stages during a determination operation DO of a program loop, thereby making it possible to determine program failure in advance before a counting operation about all stages is completed or performed. In example embodiments, in the case where a result of a failure bit counting operation about a specific stage indicates program failure, counting operations about remaining stages may be skipped.

Figure 9:
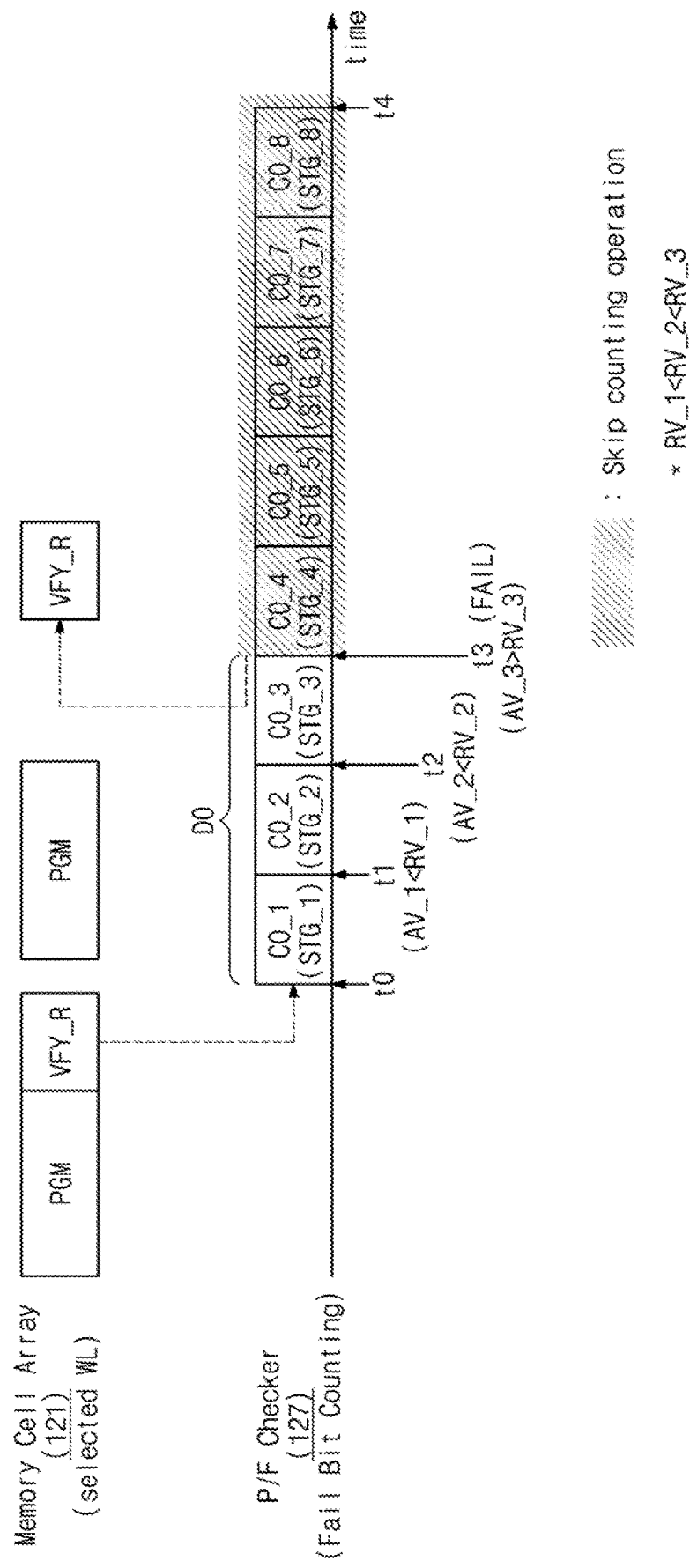
FIG. 9 illustrates an embodiment relating to the program loops in FIG. 8.

FIG. 9 illustrates an embodiment according to an operation of FIG. 8. In FIG. 9, the X-axis corresponds to time. For descriptive convenience, a description about duplicated components and operations will be omitted. Referring to FIGS. 5, 7, and 9, from t0 to t1, the P/F checker 127 may perform a first counting operation CO1 about the first stage STG_1 to generate a first accumulated value AV_1. At t1, the P/F checker 127 may compare the first accumulated value AV_1 and the first reference value RV_1.

In the case where the first accumulated value AV_1 is less than the first reference value RV_1, from t1 to t2, the P/F checker 127 may perform a second counting operation CO2 about the second stage STG_2 to generate a second accumulated value AV_2. At t2, the P/F checker 127 may compare the second accumulated value AV_2 and the second reference value RV_2.

In example embodiments, in the case where the second accumulated value AV_2 is less than the second reference value RV_2, from t2 to t3, the P/F checker 127 may perform a third counting operation CO3 about the third stage STG_3 to generate a third accumulated value AV_3. At t3, the P/F checker 127 may compare the third accumulated value AV_3 and the third reference value RV_3.

In example embodiments, in the case where the third accumulated value AV_3 is greater than the third reference value RV_3, the P/F checker 127 may determine a program operation of a current program loop as being program failure and may output a failure signal FAIL to the control circuit 124. The P/F checker 127 may skip fourth to eighth counting operations CO_4 to CO_8 about remaining stages (e.g., the fourth to eighth stages STG_4 to STG_8). The control circuit 124 may perform a verification read operation VFY_R of a next program loop in response to the failure signal FAIL.

As described above, one type of P/F checker may perform a counting operation up to t4 (e.g., perform first to eighth counting operations CO_1 to CO_8 about the first to eighth stages STG_1 to STG_8) and may generate a final accumulated value. Afterwards, this P/F checker may determine program pass or program failure. However, the P/F checker 127 according to example embodiments may previously determine program pass or program failure by changing a reference value during a determination operation DO, thereby reducing overhead (e.g., the fourth to eighth counting operations CO_4 to CO_8 about the fourth to eighth stages STG_4 to STG_8) due to a counting operation. Thus, a program speed of the nonvolatile memory device may be improved.

Figure 10:
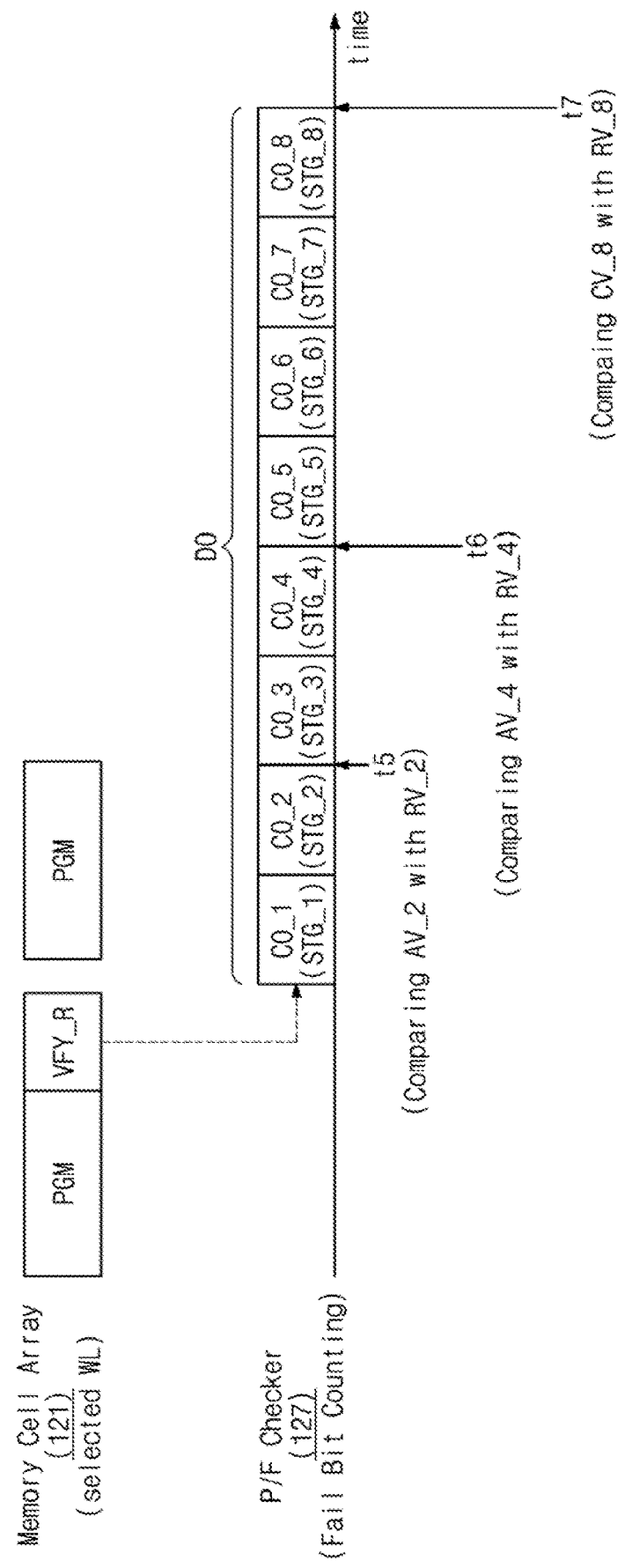
FIG. 10 illustrates an embodiment of a timing diagram for a P/F checker.

FIG. 10 illustrates a timing diagram corresponding to another embodiment of a P/F checker of FIG. 5. For the sake of brevity, a description about the above-described components or a duplicated description may be omitted.

Referring to FIGS. 5 and 10, the P/F checker 127 may perform first to eighth counting operations CO_1 to CO_8 about the first to eighth stages STG_1 to STG_9 in a method similar to that described with reference to FIGS. 1 to 10. Example embodiments of FIG. 10 may be different from example embodiments of FIG. 9 in that an accumulated value and a reference value are compared after counting operations about the predetermined number of stages.

For example, the P/F checker 127 may perform first and second counting operations CO_1 and CO_2 about the first and second stage STG_1 and STG_2 to generate the second accumulated value AV_2; at t5, the P/F checker 127 may compare the second accumulated value AV_2 and the second reference value RV_2. Afterwards, the P/F checker 127 may perform third and fourth counting operations CO_3 and CO_4 about the third and fourth stage STG_3 and STG_4 to generate the fourth accumulated value AV_4; at t6, the P/F checker 127 may compare the fourth accumulated value AV_4 and the fourth reference value RV_4.

In example embodiments, as described above, in the case where a comparison result indicates program fail, the P/F checker 127 may output a failure signal FAIL, and the control circuit 124 may skip a counting operation about remaining stages in response to the failure signal FAIL and may perform a next program loop or a verification read operation of the next program loop.

Example embodiments are exemplified as an accumulated value and a reference value are compared after counting operations about a specific stage are performed. In one embodiment, the P/F checker 127 may compare an accumulated value and a reference value corresponding thereto after performing a counting operation about the predetermined number of stages.

Figure 11:
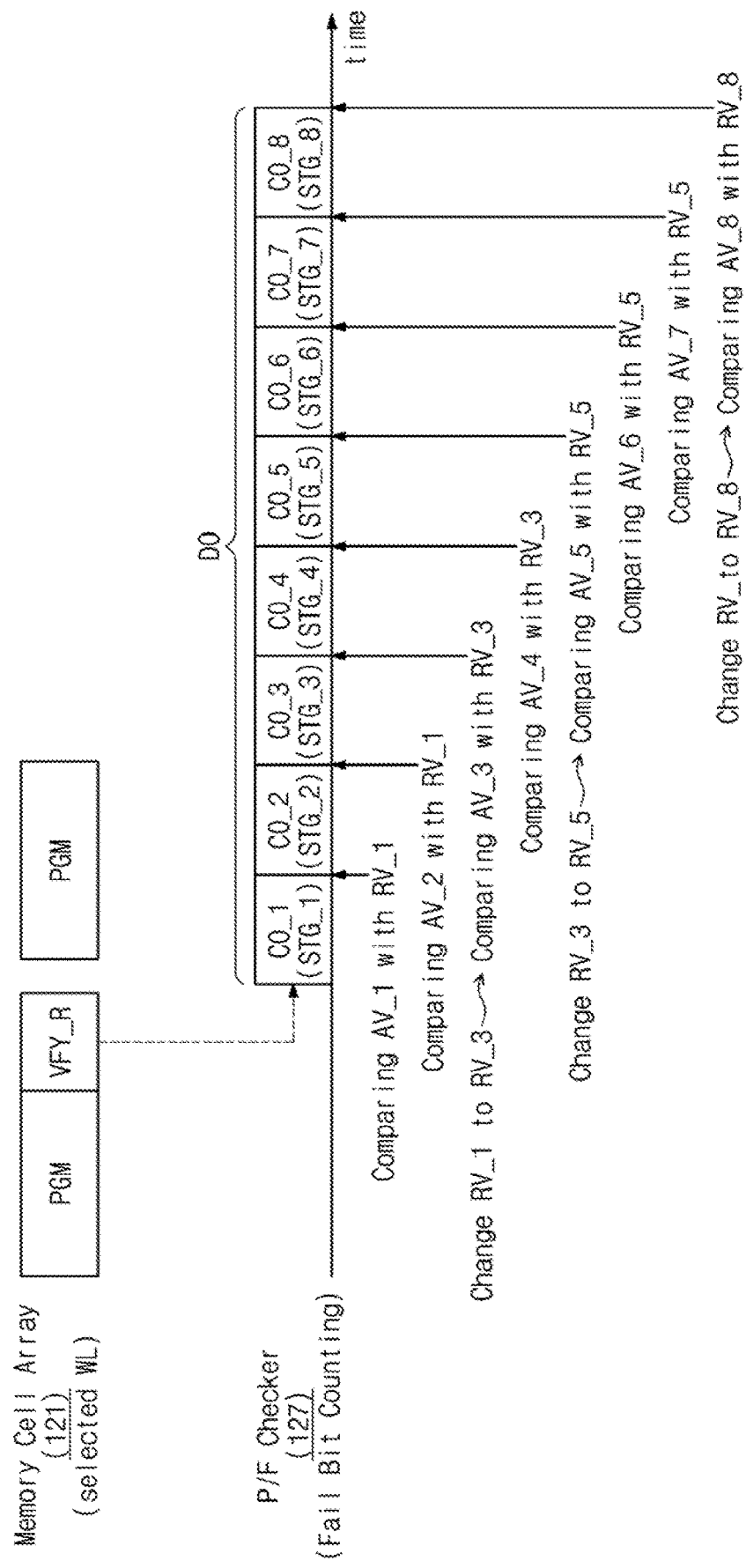
FIG. 11 illustrates an embodiment of a timing diagram for a nonvolatile memory device.

FIG. 11 is a timing diagram for an example embodiment of a nonvolatile memory device. For the sake of brevity, a description about the above-described components or a duplicated description may be omitted.

Referring to FIGS. 5 and 11, the P/F checker 127 may perform first to eighth counting operations CO_1 to CO_8 about the first to eighth stages STG_1 to STG_9 in a method similar to that described with reference to FIGS. 1 to 10. Example embodiments of FIG. 11 may be different from example embodiments of FIGS. 9 and 10 in that a counting operation and a comparison operation about each of the first to eighth stages STG_1 to STG_8 are performed and a reference value is changed after a counting operation about a specific stage.

For example, the P/F checker 127 may perform a first counting operation CO_1 about the first stag STG_1 to generate the first accumulated value AV_1 and may compare the first accumulated value AV_1 and the first reference value RV_1. Afterwards, the P/F checker 127 may perform a second counting operation CO_2 about the second stag STG_2 to generate the second accumulated value AV_2 and may compare the second accumulated value AV_2 and the first reference value RV_1. Afterwards, the P/F checker 127 may perform the third counting operation CO_3 about the third stage STG_3 to generate the third accumulated value AV_3. At this time, the P/F checker 127 may change a reference value from the first reference value RV_1 to the third reference value RV_3. The P/F checker 127 may compare the third accumulated value AV_3 and the third reference value RV_3.

Similarly, the P/F checker 127 may perform fourth to eighth counting operations CO_4 to CO_8 about the fourth to eighth stages STG_4 to STG_8 to generate fourth to eighth counted values AV_4 to AV_8, and the P/F checker 127 may compare an accumulated value and a reference value corresponding thereto. At this time, the P/F checker 127 may change the third reference value RV_3 to the fifth reference value RV_5 after a fifth counting operation CO_5 about the fifth stage STG_5 and may change the fifth reference value RV_5 to the eighth reference value RV_8 after an eighth counting operation CO_8 about the eighth stage STG_8.

In example embodiments, as described above, in the case where a comparison result indicates program failure, the P/F checker 127 may output a failure signal FAIL, and the control circuit 124 may skip a counting operation about remaining stages in response to the failure signal FAIL and may perform a next program loop or a verification read operation of the next program loop.

Example embodiments are exemplified as a reference value is changed after a counting operation about a specific stage is performed. In another embodiment, the P/F checker 127 may change a reference value after performing a counting operation about the predetermined number of stages.

Figure 12:
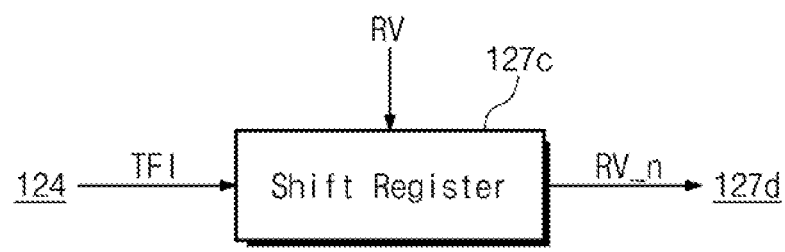
FIG. 12 illustrates an embodiment of a reference value managing unit.

FIG. 12 illustrates an embodiment of a reference value managing unit of FIG. 5. Referring to FIGS. 5 and 12, the reference value managing unit 127c may be implemented with a shift register. The shift register 127c may receive a representative reference value RV from a separate storage device (e.g., a register, a fuse, or the like). In example embodiments, the representative reference value may be a value which is previously determined according to the error correction ability of the ECC 111, a read margin, the number of bits stored in a memory cell, or a target program state. In example embodiments, the read margin may indicate a difference between a verification voltage about a program state and a read voltage about the program state. The shift register 127c may output a reference value RV_n in response to transmission information TFI from the control circuit 124.

For example, the control circuit 124 may output the transmission signal TF such that a plurality of stages of the page buffer circuit 125 is sequentially or non-sequentially activated. The control circuit 124 may provide the reference value managing unit 127c with the transmission information TFI based on the transmission signal TF. Thus, the transmission information TFI may include information on the number of activated stages or information on an activated stage.

The shift register 127c may output the reference value RV_n in response to the transmission information TFI. In example embodiments, the reference value RV_n may be a value which corresponds to each stage or corresponds to each group of stages.

Figure 13:
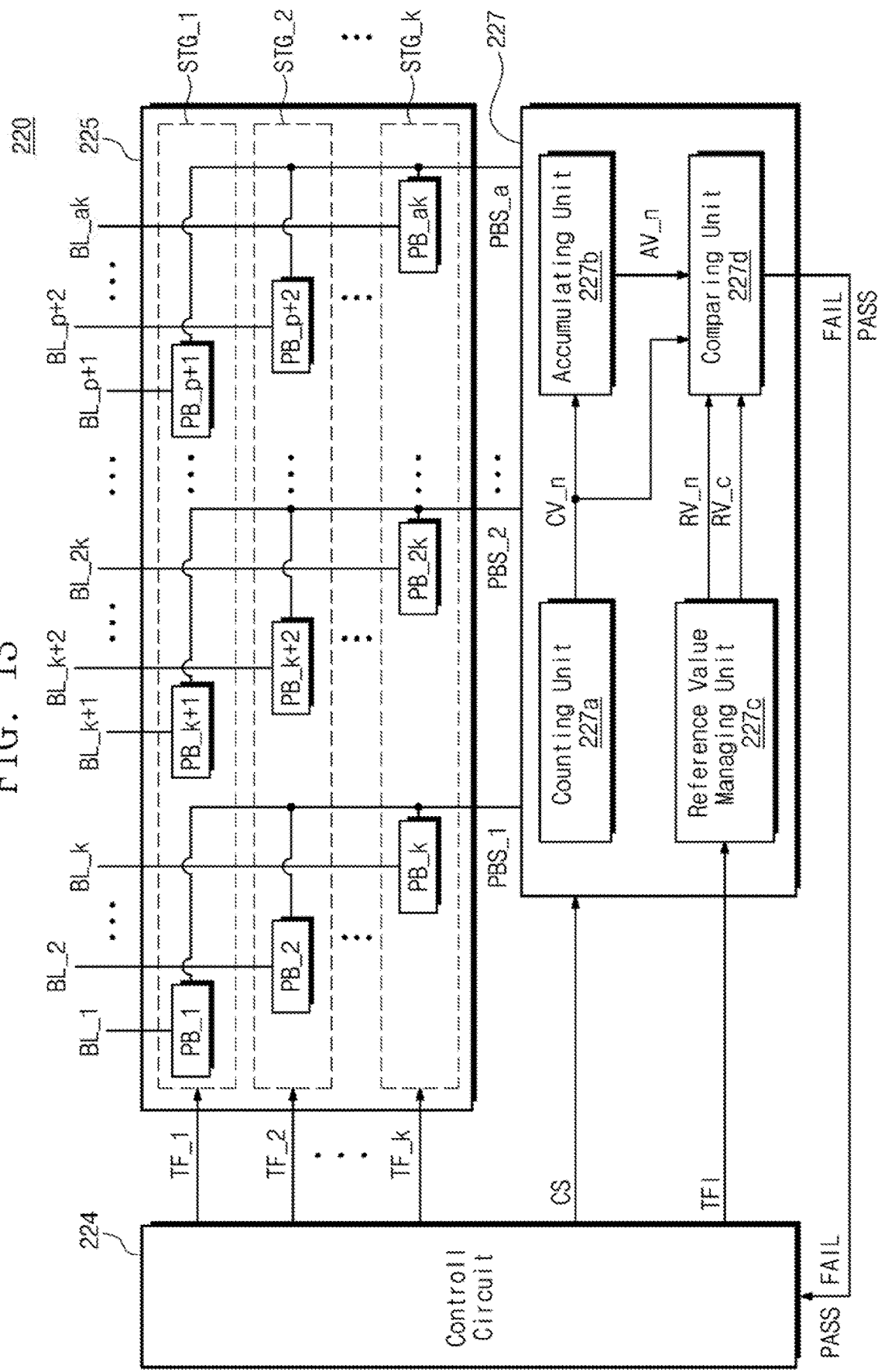
FIG. 13 illustrates another embodiment of a nonvolatile memory device.

FIG. 13 illustrates another embodiment of a nonvolatile memory device. A control circuit 224, a page buffer circuit 225, a plurality of stages STG_1 to STG_k, a P/F checker 227, a counting unit 227a, an accumulating unit 227b, a reference value managing unit 227c, and a comparing unit 227d are described with reference to FIG. 5.

The reference value managing unit 227c may generate a reference values RV_n based on the transmission information TFI. The reference value managing unit 227c may output a fixed reference values RV_c. The fixed reference value RV_c may be a value which is to be compared with a counted value CV_n.

Similarly to a method described with reference to FIGS. 1 to 12, the comparing unit 227d may compare an accumulated value AV_n and a reference value RV_n corresponding thereto and may determine program pass or program failure based on the comparison result. The comparing unit 227d may compare a counted value CV_n and the fixed reference value RV_c and may determine program pass or program failure based on the comparison result. For example, the P/F checker 227 may perform a counting operation about a specific stage (e.g., the third stage STG_3) to generate the third counted value CV_3 and the third accumulated value AV_3. The P/F checker 227 may compare the third counted value CV_3 and the fixed reference value RV_c and may determine program pass or program failure based on the comparison result.

In example embodiments, that the third counted value CV_3 is greater than the fixed reference value RV_c may mean that a number of memory cells, corresponding to a failure bit, from among memory cells corresponding to the third stage STG_3 exist. For example, in the case where the third counted value CV_3 is greater than the fixed reference value RV_c, the probability of program failure may be high. In the case where the third accumulated value CV_3 is greater than the fixed reference value RV_c, the P/F checker 227 may determine a program operation of a current program loop as being program failure. For the program failure, the control circuit 124 may skip a counting operation about remaining stages and may perform a next program loop or a verification step of the next program loop.

Figure 14:
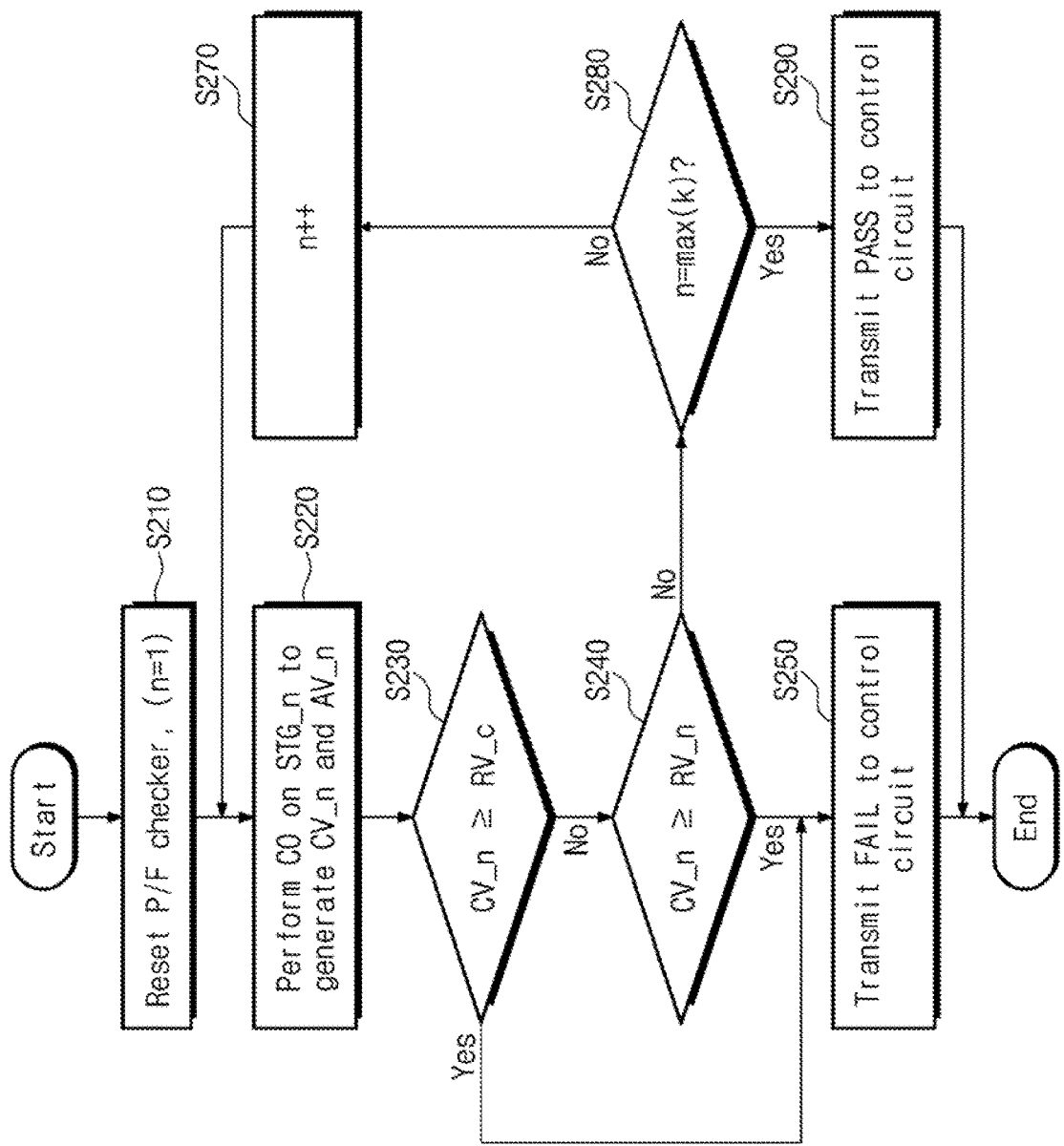
FIG. 14 illustrates an embodiment of an operation of the nonvolatile memory device of FIG. 13.

FIG. 14 illustrates an embodiment of an operation of the nonvolatile memory system of FIG. 13. Referring to FIGS. 13 and 14, the P/F checker 227 may perform operations S210 to S220. Operations S210 and S220 may be similar to operations S110 and S120 of FIG. 6.

In operation S230, the P/F checker 227 may compare an n-th counted value CV_n and the fixed reference value RV_c. As described with reference to FIG. 13, the P/F checker 227 may compare the n-th counted value CV_n about one stage (e.g., the n-th stage STG_n) and the fixed reference value RV_c. In the case where the n-th counted value CV_n is greater than or equal to the fixed reference value RV_c, the P/F checker 227 may determine a program operation of a current program loop as being program failure and may perform operation S250.

In the case where the n-th counted value CV_3 is less than the fixed reference value RV_c, the P/F checker 227 may perform operations S240 to S290. Operations S240 to S290 may be similar to those of operation S130 to S170 of FIG. 6.

In example embodiments, an order of operations S230 and S240 may be different from the order in FIG. 14. For example, operation S240 may be performed prior to operation S230, operation S230 may be performed according to a result of operation S240, and operation S260 may be performed according to a result of operation S230. Alternatively, operations S230 and S240 may be performed in parallel (or together). In the case where a result of operations S230 or step S240 indicates program failure, operation S250 may be performed.

Figure 15:
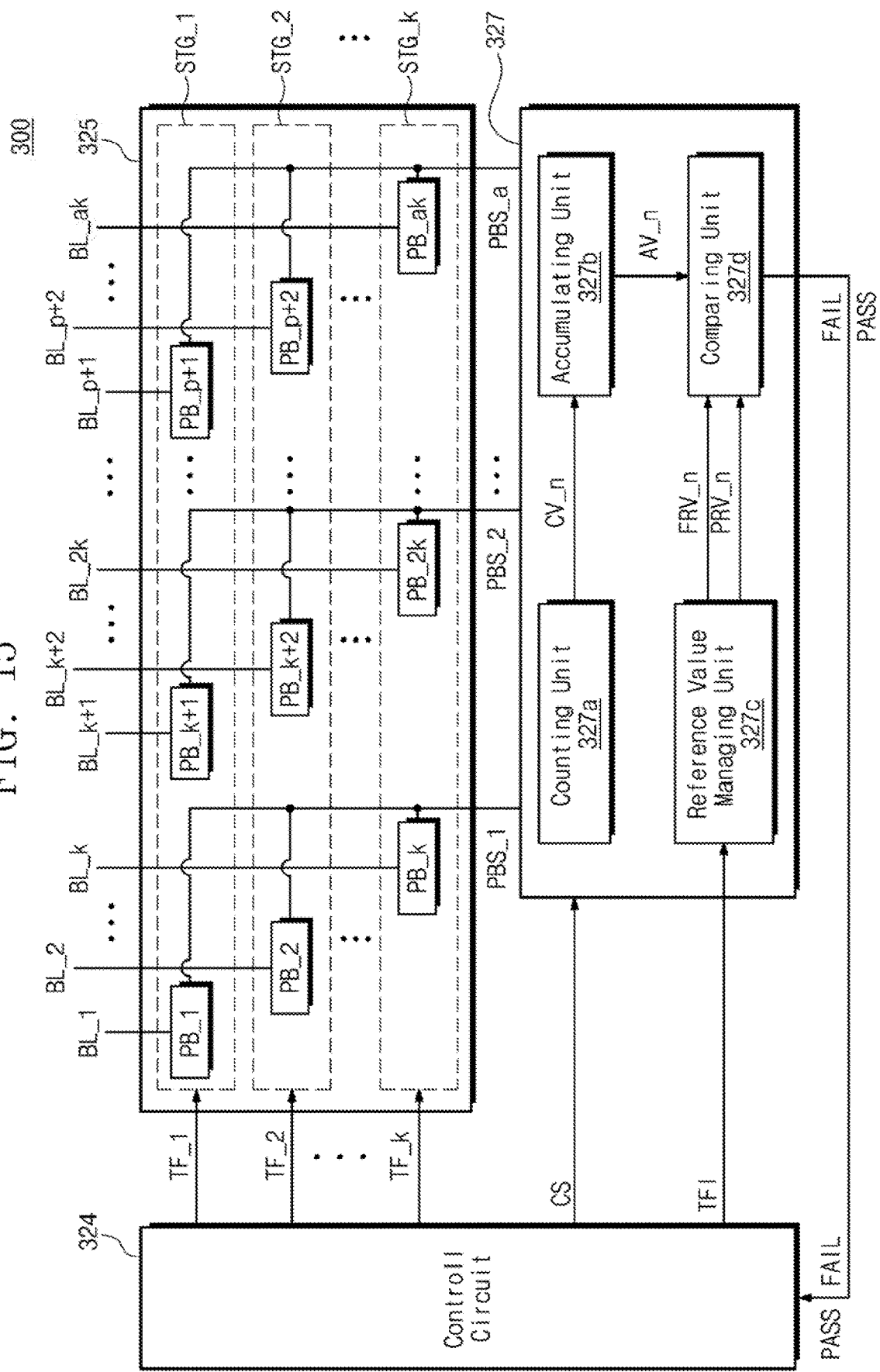
FIG. 15 illustrates another embodiment of a nonvolatile memory device.

FIG. 15 illustrates another embodiment of a nonvolatile memory device 300 which may include a control circuit 324, a page buffer circuit 325, and a P/F checker 327. As described with reference to FIG. 2, the nonvolatile memory device 300 may further include components such as a memory cell array, an address decoder, a voltage generator, and/or an input/output circuit.

The page buffer circuit 325 may include a plurality of stages STG_1 to STG_k, each of which includes a plurality of page buffers PB. The P/F checker 327 may include a counting unit 327a, an accumulating unit 327b, a reference value managing unit 327c, and a comparing unit 327d. Various components in the nonvolatile memory device 300 are described with reference to FIG. 2.

Unlike P/F checkers 127 and 227 described with reference to FIGS. 1 to 14, the P/F checker 327 of FIG. 15 may predict program pass. For example, the reference value managing unit 327c of the P/F checker 327 may output a failure reference value FRV_n and a pass reference value PRV_n. Similarly to the above description, the P/F checker 327 may output the failure reference value FRV_n and the pass reference value PRV_n in response to transmission information TFI of the control circuit 324. In example embodiments, the failure reference value FRV_n may indicate a reference value for determining program failure, and the pass reference value PRV_n may indicate a reference value for determining program pass. In example embodiments, the pass reference value PRV_n may be less than or equal to the failure reference value FRV_n. In example embodiments, the pass reference value PRV_n may be determined according to at least one of the error correction ability of the ECC 111, a read margin, the number of bits stored in a cell, or a target program state.

For example, the P/F checker 327 may perform a counting operation for each of first to third stages STG_1 to STG_3 to generate a third accumulated value AV_3. The comparing unit 327d may compare the third accumulated value AV_3 and a third pass reference value PRV_3. In example embodiments, in the case where the third accumulated value AV_3 is less than the third pass reference value PRV_3, the probability of program failure may increase. Accordingly, in the case where the third accumulated value AV_3 is less than the third pass reference value PRV_3, the comparing unit 327d may output a pass signal PASS.

For example, in the case where a counted value about each of the first to eighth stages STG_1 to STG_8 is a 5-bit value and a failure reference value is a 80-bit value, the P/F checker 327 may determine program pass after performing a counting operation about each of the first to eighth stages STG_1 to STG_8 and may output a pass signal PASS. However, in the case where the third pass reference value PRV_3 about the third stage STG_3 is set to 18 bits, the P/F checker 327 may determine program pass after performing a counting operation about the third stage STG_3 and may output a pass signal PASS. In this case, a counting operation about remaining stages (e.g., the fourth to eighth stages STG_4 to STG_8) may be skipped.

In example embodiments, the control circuit 324 may terminate a program operation in response to the pass signal PASS. Alternatively, the control circuit 324 may further perform program loops for programming memory cells, corresponding to another target program state, in response to the pass signal PASS.

As described above, the P/F checker 327 may compare an accumulated value and a pass reference value PRV_n corresponding thereto, thereby making it possible to determine program pass in advance. In this case, overhead due to a counting operation about remaining stages may be reduced.

Figure 16:
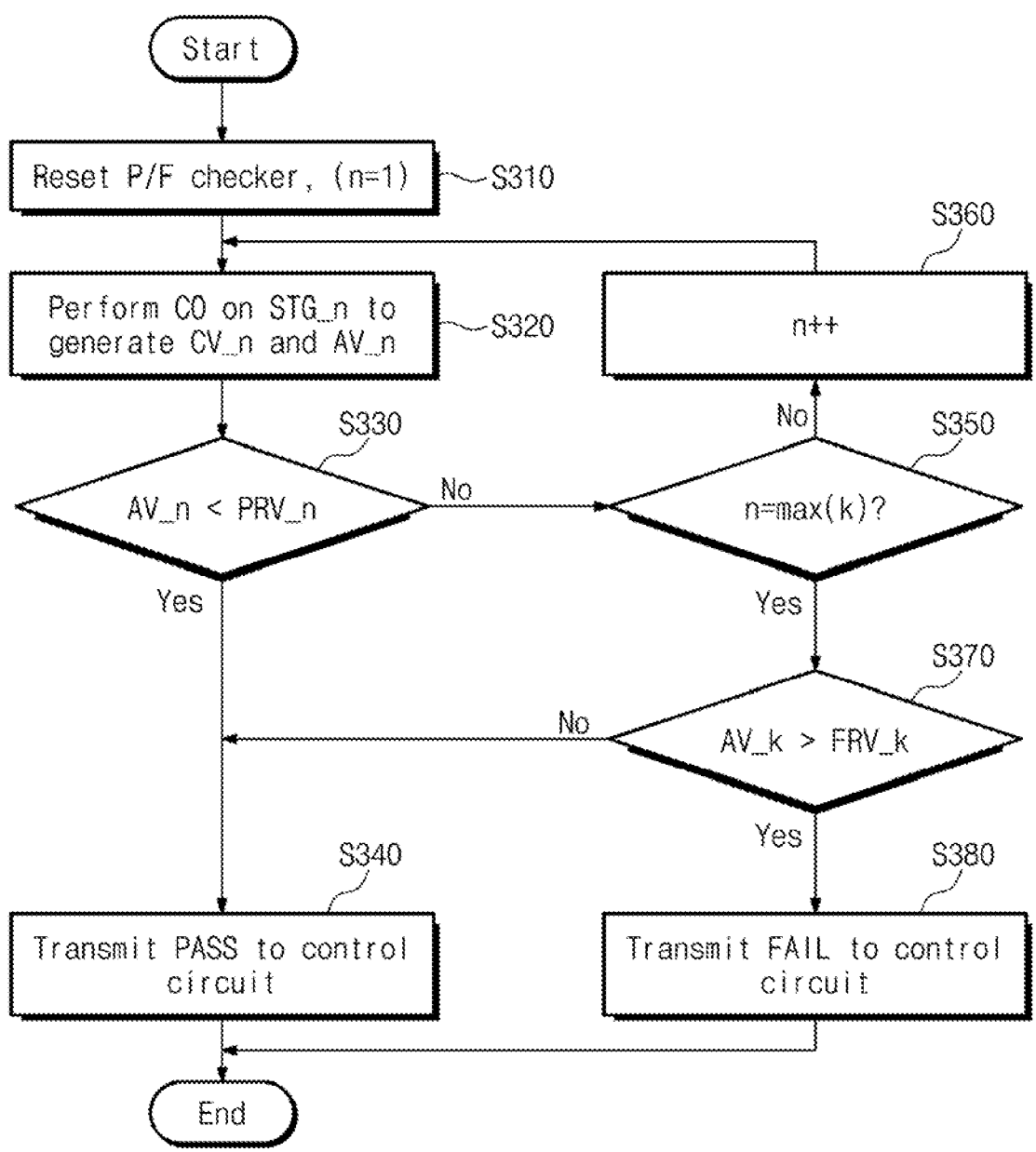
FIG. 16 illustrates an embodiment of an operation of a P/F checker for the nonvolatile memory device of FIG. 15.

FIG. 16 illustrates an embodiment of an operation of the pass/failure checker in FIG. 15. Referring to FIGS. 15 and 16, the P/F checker 327 may perform operations S310 to S320. Operations S310 and S320 may be similar to those of operations S110 and S120 of FIG. 6.

In operation S330, the P/F checker 327 may compare an n-th accumulated value AV_n and an n-th pass reference value PRV_n. As described above, in the case where the n-th accumulated value AV_n is smaller than or equal to the n-th pass reference value PRV_n, the probability of program failure may increase. That is, in the case where the n-th accumulated value AV_n is smaller than or equal to the n-th pass reference value PRV_n, in operation S340, the P/F checker 327 may output a pass signal PASS to the control circuit 324.

In the case where the n-th accumulated value AV_n is greater than the n-th pass reference value PRV_n, in operation S350, the P/F checker 327 may determine whether the variable n is the same as a maximum value k. Thus, the P/F checker 327 may determine whether a counting operation is performed with respect to all page buffers of all stages STG_1 to STG_k in the page buffer circuit 325. In the case where the variable n is not the same as the maximum value, in operation S360, the variable n may increase by one, and the procedure may proceed to operation S320.

In the case where the variable n is the same as the maximum value, in operation S370, the P/F checker 327 may compare a k-th accumulated value AV_k (e.g., k being the maximum value) and a k-th failure reference value FRV_k. In example embodiments, the k-th failure reference values FRV_k may be a representative failure reference value. The representative failure reference value may be determined according to at least one of the error correction ability of the ECC 111, a read margin, the number of bits stored in a cell, or a target program state.

In the case where the k-th accumulated value AV_k is greater than or equal to the k-th failure reference value FRV_k, in operation S380, the P/F checker 327 may transmit a failure signal FAIL to the control circuit 324; in the case where the k-th accumulated value AV_k is less than the k-th failure reference value FRV_k, in operation S340, the P/F checker 327 may transmit a pass signal PASS to the control circuit 324.

In example embodiments, the control circuit 324 may terminate a program operation in response to the pass signal PASS or the failure signal FAILURE or may perform a next program loop or a verification step of the next program loop in response thereto.

Figure 17:
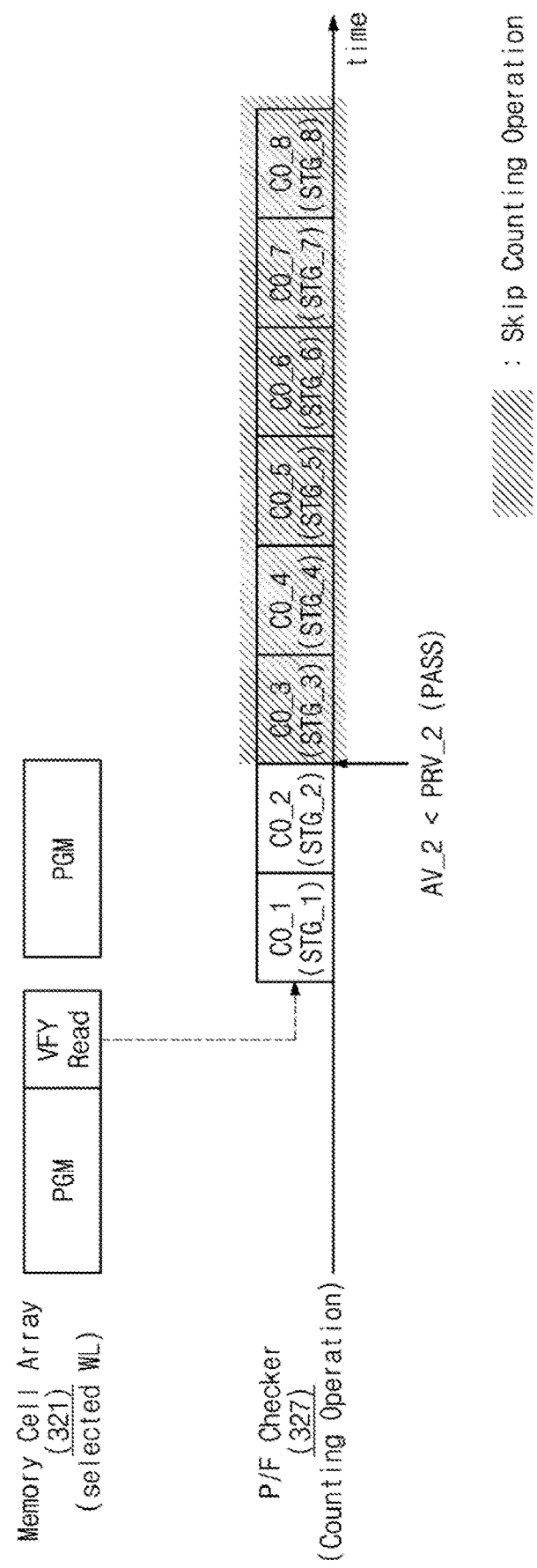
FIG. 17 illustrates an embodiment of an operating method relating to the P/F checker of FIG. 16.

FIG. 17 illustrates an embodiment of an operating method of FIG. 16. For the sake of brevity, a description about the above-described components or a duplicated description may be omitted.

Referring to FIGS. 15 to 17, the P/F checker 327 may sequentially perform a counting operation about each of the first to eighth stages STG_1 to STG_8 under control of the control circuit 324. In example embodiments, as described with reference to FIGS. 15 and 16, the P/F checker 327 may compare an accumulated value AV_n and a pass reference value PRV_n corresponding thereto, thereby making it possible to determine program pass in advance.

For example, as illustrated in FIG. 17, the P/F checker 327 may perform a counting operation about each of first and second stages STG_1 and STG_2 to generate a second accumulated value AV_2. The P/F checker 327 may compare the second accumulated value AV_2 and the second pass reference value PRV_2. In the case where the second accumulated value AV_2 is smaller than the second pass reference value PRV_2, the P/F checker 327 may determine a program operation of a current program loop as being program pass and may output a pass signal PASS to the control circuit 324. Thus, the case that the number of memory cells, not yet program-completed, from among memory cells corresponding to the first and second stages STG_1 and STG_2 may be determined as being program pass.

In example embodiments, the control circuit 324 may not perform a counting operation about remaining stages (e.g., STG_3 to STG_8).

Figure 18:
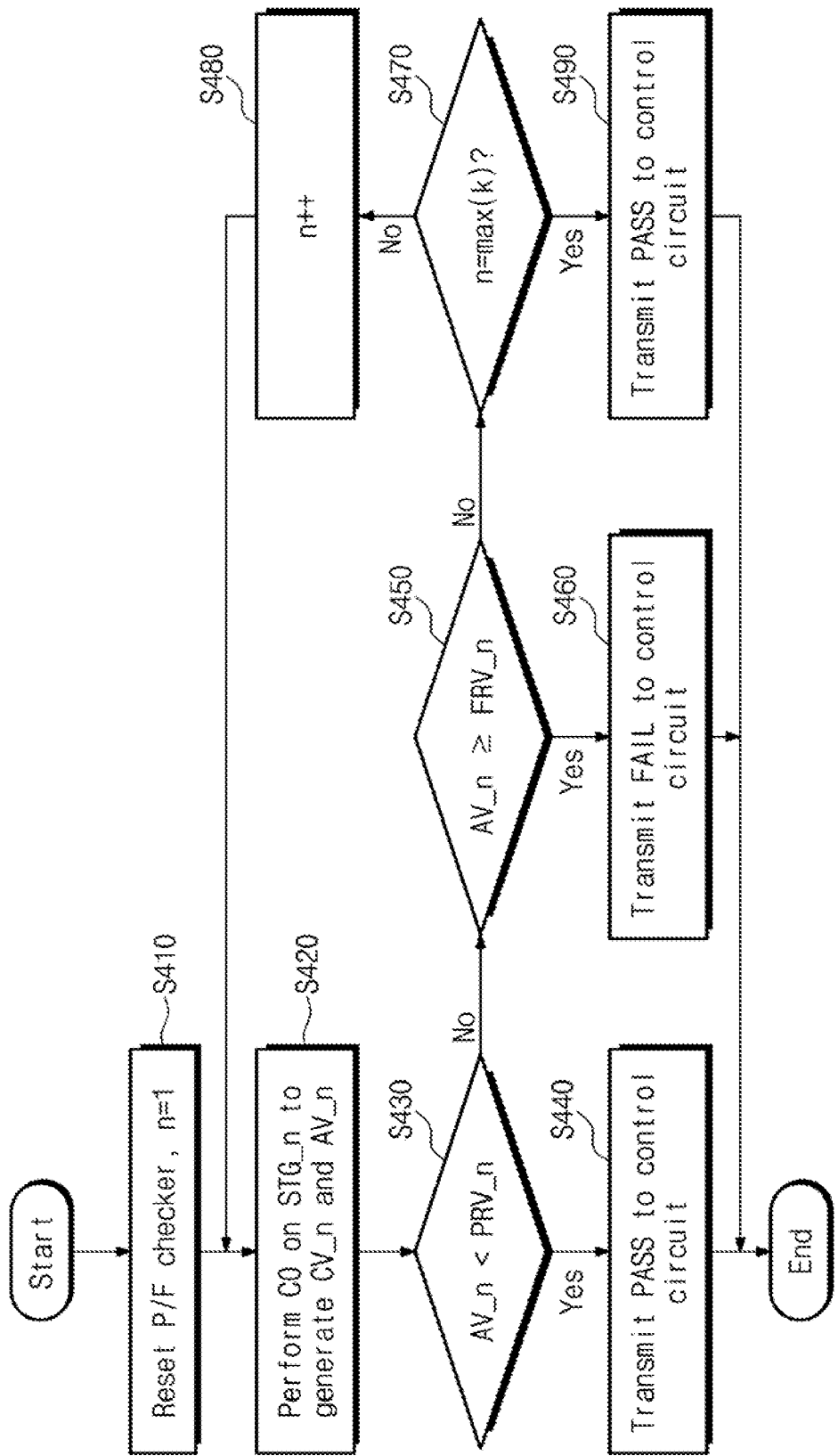
FIG. 18 illustrates an embodiment of another operation of the P/F checker for the nonvolatile memory device of FIG. 14.

FIG. 18 illustrates another embodiment an operation performed by the pass/failure checker of FIG. 14. Referring to FIGS. 14 and 18, the P/F checker 327 may perform operations S410 to S440. Operations S410 to S440 may be similar to those of operation S310 to S340 of FIG. 15. In the case where an n-th accumulated value AV_n is greater than an n-th pass reference value PRV_n, the P/F checker 327 may perform operations S450 to S490. Operations S450 to S490 may be similar to those of operations S130 to S170 of FIG. 6.

Figure 19:
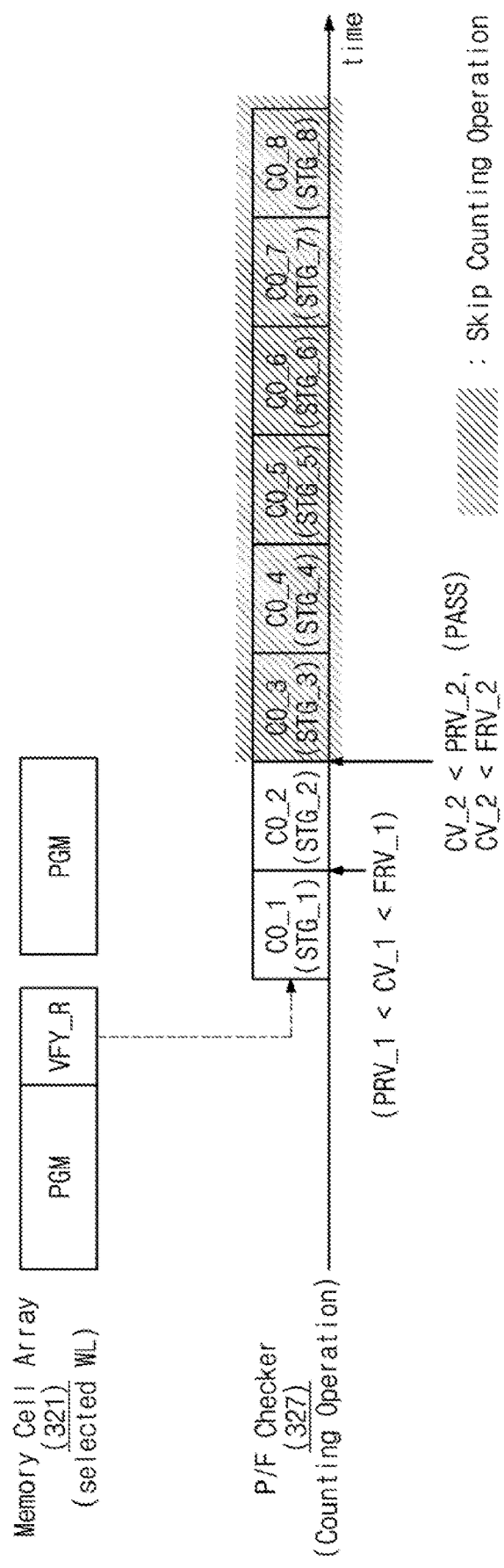
FIG. 19 illustrates an embodiment of a timing diagram for an operating method relating to operation of the P/F checker in FIG. 18.

FIG. 19 is a timing diagram for describing another embodiment of an operating method of FIG. 18. Referring to FIGS. 14, 18, and 19, the P/F checker 327 may perform a counting operation about each of the first to eighth stages STG_1 to STG_8 under control of the control circuit 324 and may generate accumulated values, and the P/F checker 327 may compare each accumulated value with a pass reference value and a failure reference value corresponding thereto.

For example, as illustrated in FIG. 19, under control of the control circuit 324, the P/F checker 327 may perform a counting operation about the first stage STG_1 to generate a first accumulated value AV_1. In the case where the first accumulated value AV_1 is greater than a first pass reference value PRV_1 and smaller than a first failure reference value FRV_1, under control of the control circuit 324, the P/F checker 327 may perform a counting operation about the second stage STG_2 to generate a second accumulated value AV_2.

In example embodiments, the second accumulated value AV_2 may be less than the second pass reference value PRV_2. In this case, the P/F checker 327 may determine a program operation of a current program loop as being program pass and may output a pass signal PASS to the control circuit 324. In example embodiments, after the program pass is determined, the control circuit 324 may skip a counting operation about remaining stages (e.g., STG_3 to STG_8).

Figure 20:
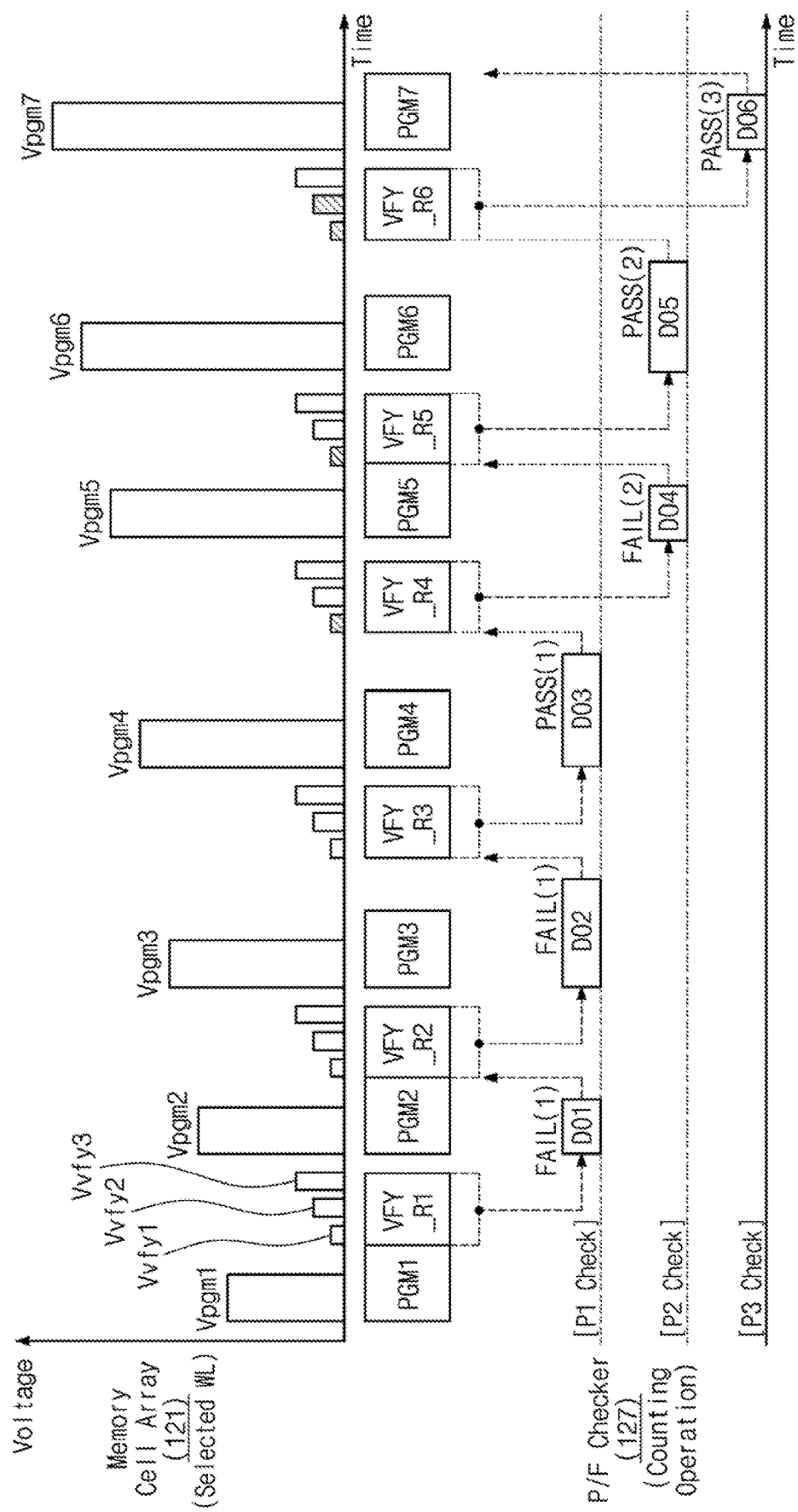
FIG. 20 illustrates an embodiment of a program operation of a nonvolatile memory device.

FIG. 20 illustrates an embodiment of a program operation of a nonvolatile memory device. It may be assumed that each of memory cells included in the nonvolatile memory device 120 is a multi-level cell storing two bits.

Referring to FIGS. 2 and 20, program voltages Vpgm1 to Vpgm7 may be applied to the memory cell array 121 (e.g., a selected word line), and first to third verification voltages Vvfy1 to Vvfy3 may be applied thereto. A program voltage (e.g., Vpgm1) and the first to third verification voltages Vvfy1 to Vvfy3 may constitute a program loop. In example embodiments, program steps PGM1 to PGM7 which the program voltages Vpgm1 to Vpgm7 are applied to the memory cell array 121 may be performed in parallel (or in overlapping relationship) with counting operations CO_1 to CO_7, respectively. The program steps PGM1 to PGM7 may be performed in a different manner in another embodiment.

In example embodiments, the first verification voltage Vvfy1 may be a verification voltage for verifying memory cells of which the target program state is a first program state P1 (refer, e.g., to FIG. 4), the second verification voltage Vvfy2 may be a verification voltage for verifying memory cells of which the target program state is a second program state P2, and the third verification voltage Vvfy3 may be a verification voltage for verifying memory cells of which the target program state is a third program state P3.

The P/F checker 127 may perform a counting operation based on a result of a first verification read operation VFY_R1 by the first to third verification voltages Vvfy1 to Vvfy3 and may determine program pass or program failure based on a result of the counting operation. At this time, the P/F checker 127 may perform a counting operation about a result of a verification read operation which is performed using a verification voltage (e.g., Vvfy1), having the lowest level, from among the first to third verification voltages Vvfy1 to Vvfy3. For example, the P/F checker 127 may perform a first counting operation CO1 based on counting operations (e.g., operations to determine program pass or program failure) described with reference to FIGS. 1 to 19 and may determine program pass or program failure based on a result of the first counting operation CO1. At this time, the first counting operation CO1 may be a counting operation which is associated with a result, which corresponds to a verification read operation performed using the first verification voltage Vvfy1, from among results of the first verification read operations VFY_R1. That is, the P/F checker 127 may determine program pass or program failure with respect to memory cells of which the target program state is the first program state, through the first counting operation CO1.

A failure signal FAIL may be output as a result of the first counting operation CO1. In this case, the first to third verification read voltages Vvfy1 to Vvfy3 may be applied to the memory cell array 121 to perform a second verification read operation VFY_R2. Afterwards, the P/F checker 127 may perform a second counting operation CO2. Likewise, the second counting operation CO2 may be a counting operation which is associated with a result of a verification read operation performed using the first verification voltage Vvfy1. A failure signal FAILURE may be output as a result of the second counting operation CO2. The P/F checker 127 may repeat the above-described operation until a result of a counting operation about a result of a verification read operation by the first verification voltage Vvfy1 is determined as being program pass.

In example embodiments, program pass PASS may be determined at a third counting operation CO3. This may mean that memory cells (e.g., memory cells of which the target program state is the first program state P1) verified using the first verification voltage Vvfy1 are normally programmed or are programmed such that an error is included in an error correctable range or so as to be read normally by a read margin.

In example embodiments, if a result of a verification read operation using the first verification voltage Vvfy1 is determined as being program pass, the first verification voltage Vvfy1 may not be applied to the memory cell array 121 in remaining verification read operations. Afterwards, the P/F checker 127 may perform a counting operation with respect to a result of a verification read operation which is performed using the second verification voltage Vvfy2.

For example, in the case where the pass signal PASS is output as a result of a third counting operation CO3, the first to third verification voltages Vvfy1 to Vvfy3 or the second and third verification voltages Vvfy2 and Vvfy3 may be applied to the memory cell array 121 to perform a fourth verification read operation VFY_R4. The P/F checker 127 may perform a fourth counting operation CO4 based on a result, which corresponds to a verification read operation performed using the second verification voltage Vvfy2, from among results of the fourth verification read operation VFY_R4. In example embodiments, a failure signal FAILURE may be output as a result of the fourth counting operation CO4. In this case, a fifth verification read operation VFY_R5 may be performed.

In the case where a result of the fourth counting operation CO4 indicates program fail, a verification read operation of a next program loop may be performed, and the P/F checker 127 may perform the fifth counting operation CO5. In the case where a pass signal is output as a result of the fifth counting operation CO5, the second verification voltage Vvfy2 may not be applied to the memory cell array 121 in remaining verification read operations. Afterwards, the P/F checker 127 may perform a counting operation with respect to a result of a verification read operation which is performed using the third verification voltage Vvfy3.

For example, in the case where the pass signal PASS is output as a result of the fifth counting operation CO5, the first to third verification voltages Vvfy1 to Vvfy3, the second and third verification voltages Vvfy2 and Vvfy3, or the third verification voltage Vvfy3 may be applied to the memory cell array 121 to perform a sixth verification read operation VFY_R6. The P/F checker 127 may perform a sixth counting operation CO6 based on a result, which corresponds to a verification read operation performed using the third verification voltage Vvfy3, from among results of the sixth verification read operation VFY_R6. In example embodiments, a pass signal PASS may be output as a result of the sixth counting operation CO6, and the control circuit 124 may terminate a program operation.

The number of program states programmed at the same time may vary in different embodiments. When n program states are programmed at the same time, programming and verifying may be performed using n verification voltages.

As described above, the P/F checker 127 may perform a counting operation sequentially according to a target program state of memory cells and may determine program pass or program failure about each target program state based on a result of the counting operation. At this time, each counting operation, as described with reference to FIGS. 1 to 19, may change a failure reference value or a pass reference value based on a plurality of stages, thereby reducing overhead due to a counting operation. For example, as illustrated in FIG. 20, the time to perform the first counting operation CO1 may be shorter than a time taken to perform the third counting operation CO3. This may mean that the number of stages counted during the first counting operation CO1 is less than the number of stages counted during the third counting operation CO3. Thus, a program time of a nonvolatile memory device may be reduced because program pass or program failure is determined in advance through the changing or adjusting of a failure reference value or a pass reference value based on each stage.

With the above-described embodiments, when determining program pass or program failure, the nonvolatile memory device may generate accumulated values through a counting operation about each stage and may compare the accumulated values with reference values corresponding thereto. The nonvolatile memory device may skip a counting operation about remaining stages after program pass or program failure is determined, thereby reducing overhead due to a counting operation. This may mean that the performance of the nonvolatile memory system is improved.

In one embodiment, the nonvolatile memory device may change a failure reference value or a pass reference value at a counting operation about each stage, may change the failure reference value or the pass reference value at a counting operation about a specific stage, or may change the failure reference value or the pass reference value after a counting operation is performed with respect to the specific number of stages.

Figure 21:
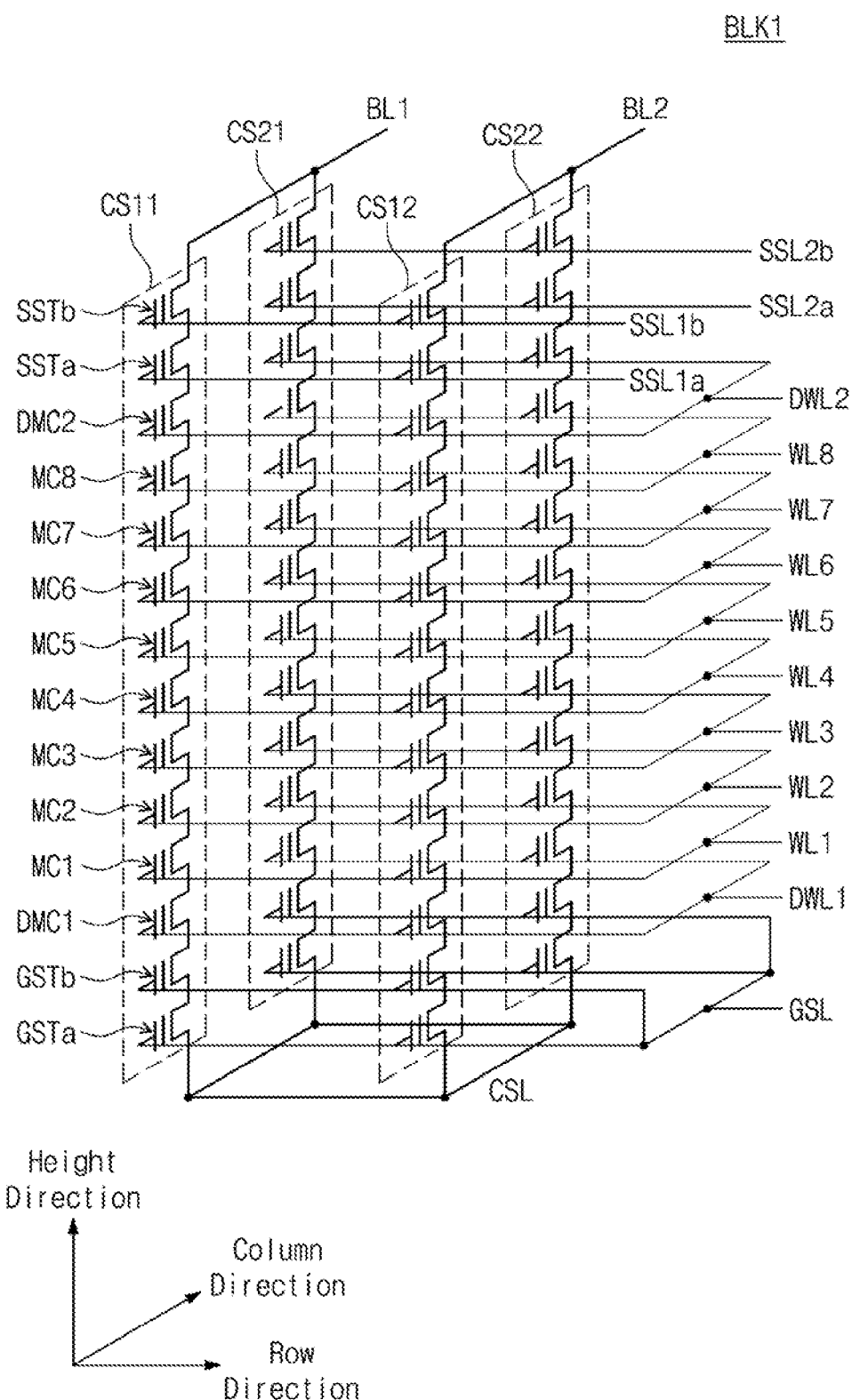
FIG. 21 illustrates an embodiment of a memory block in a cell array of a nonvolatile memory device.

FIG. 21 illustrates an embodiment of one memory block in a cell array of a nonvolatile memory device of FIG. 21. In FIG. 21, there is illustrated a first memory block BLK1 having a three-dimensional structure. The remaining memory blocks may have the same structure as the first memory block BLK1. The memory blocks may have a different structure in another embodiment.

Referring to FIG. 21, the first memory block BLK1 may include a plurality of cell strings CS11, CS12, CS21, and CS22. The cell strings CS11, CS12, CS21, and CS22 arranged along a row direction and a column direction and may form rows and columns.

For example, the cell strings CS11 and CS12 may be connected to string selection lines SSL1a and SSL1b to form a first row. The cell strings CS21 and CS22 may be connected to string selection lines SSL2a and SSL2b to form a second row. The cell strings CS11 and CS21 may be connected to a first bit line BL1 to form a first column. The cell strings CS12 and CS22 may be connected to a second bit line BL2 to form a second column.

Each of the cell strings CS11, CS12, CS21, and CS22 may include a plurality of cell transistors. Each of the cell strings CS11, CS12, CS21, and CS22 may include string selection transistor SSTa and SSTb, a plurality of memory cells MC1 to MC8, ground selection transistors GSTa and GSTb, and dummy memory cells DMC1 and DMC2.

In example embodiments, each of the memory cells included in the cell strings CS11, CS12, CS21, and CS22 may be a charge trap flash (CTF) memory cell.

The memory cells MC1 to MC8 may be serially connected and may be stacked a height direction being a direction perpendicular to a plane defined by a row direction and a column direction. The string selection transistors SSTa and SSTb may be serially connected and may be disposed between the memory cells MC1 to MC8 and a bit line BL. The ground selection transistors GSTa and GSTb may be serially connected and may be between the memory cells MC1 to MC8 and a common source line CSL.

In example embodiments, a first dummy memory cell DMC1 may be between the memory cells MC1 to MC8 and the ground selection transistors GSTa and GSTb. In example embodiments, a second dummy memory cell DMC2 may be between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL. In example embodiments, ground selection transistors in the same row may be connected to the same ground selection line, and ground selection transistors in different rows may be connected to different ground selection lines.

Memory cells placed at the same height from the substrate (or the ground selection transistors GSTa and GSTb) may be connected in common to the same word line, and memory cells placed at different heights therefrom may be connected to different word lines. In example embodiments, dummy memory cells at the same height may be connected to the same dummy word line, and dummy memory cells at different heights may be connected to different dummy word lines.

String selection transistors, belonging to the same row, from among the first string selection transistors SSTa at the same height may be connected to the same string selection line, and string selection transistors belonging to different rows may be connected to different string selection lines. For example, the first string selection transistors SSTa of the cell strings CS11 and CS12 in the first row may be connected in common to the string selection line SSL1a, and the first string selection transistors SSTa of the cell strings CS21 and CS22 in the second row may be connected in common to the string selection line SSL1a.

Likewise, string selection transistors, belonging to the same row, from among the second string selection transistors SSTb at the same height may be connected to the same string selection line, and string selection transistors in different rows may be connected to different string selection lines. For example, the second string selection transistors SSTb of the cell strings CS11 and CS12 in the first row may be connected in common to a string selection line SSL1b, and the second string selection transistors SSTb of the cell strings CS21 and CS22 in the second row may be connected in common to a string selection line SSL2b.

String selection transistors of cell strings in the same row may be connected in common to the same string selection line. For example, the first and second string selection transistors SSTa and SSTb of the cell strings CS11 and CS12 in the first row may be connected in common to the same string selection line. The first and second string selection transistors SSTa and SSTb of the cell strings CS21 and CS22 in the second row may be connected in common to the same string selection line.

In the first memory block BLK1, read and write operations may be performed by the row. For example, one row of the first memory block BLK1 may be selected by the string selection lines SSL1a, SSL1b, SSL2a, and SSL2b. In the memory block BLK1, memory cells may be erased by the memory block or by the sub-block.

The first memory block BLK1 in FIG. 21 may be an example. For example, the number of cell strings may increase or decrease, and the number of rows of cell strings and the number of columns of cell strings may increase or decrease according to the number of cell strings. In the first memory block BLK1, the number of cell strings (GST, MC, DMC, SST, or the like) may increase or decrease, and a height of the first memory block BLK1 may increase or decrease according to the number of cell strings (GST, MC, DMC, SST, or the like). Furthermore, the number of lines (GSL, WL, DWL, SSL, or the like) connected to cell transistors may increase or decrease according to the number of cell strings (GST, MC, DMC, SST, or the like).

Figure 22:
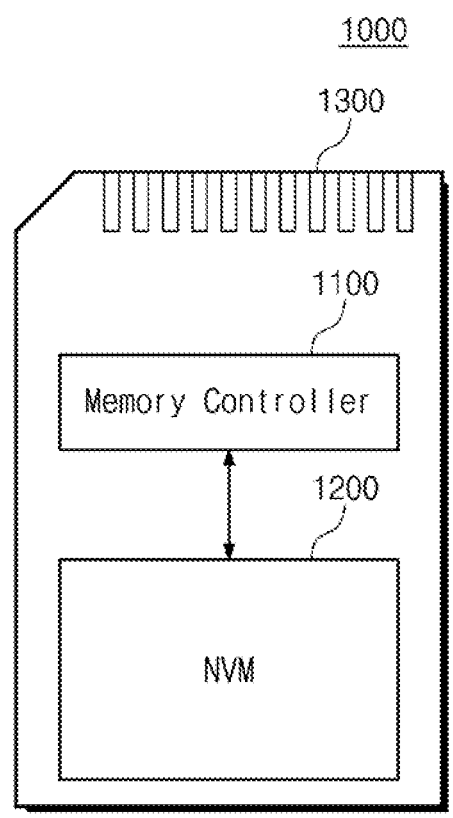
FIG. 22 illustrates an embodiment of a memory card system.

FIG. 22 illustrates an embodiment of a memory card system 1000 including a storage device according to one or more embodiments. Referring to FIG. 22, the memory card system 1000 may include a memory controller 1100, a nonvolatile memory device 1200, and a connector 1300.

The memory controller 1100 may be connected to and access the nonvolatile memory device 1200. For example, the memory controller 1100 may be adapted to control an overall operation of the nonvolatile memory device 1200 including, but not limited to, a read operation, a write operation, an erase operation, and a background operation. The background operation may include the following operations: wear-leveling management, garbage collection, and the like.

The memory controller 1100 may provide an interface between the nonvolatile memory device 1200 and a host and may drive firmware for controlling the nonvolatile memory device 1200. In example embodiments, the memory controller 1100 may include components such as, but not limited to, a RAM, a processing unit, a host interface, a memory interface, and an error correction unit.

The memory controller 1100 may communicate with an external device through the connector 1300. The memory controller 1100 may communicate with an external device based on a specific communication protocol. For example, the memory controller 1100 may communicate with the external device through at least one of various communication protocols such as, but not limited to, double data rate (DDR) interface, universal serial bus (USB), multimedia card (MMC), eMMC (embedded MMC), peripheral component interconnection (PCI), PCI-express (PCI-E), advanced technology attachment (ATA), a serial-ATA, parallel-ATA, small computer small interface (SCSI), enhanced small disk interface (ESDI), integrated drive electronics (IDE), universal flash storage (UFS), nonvolatile memory express (NVMe), and the like.

The nonvolatile memory device 1200 may be implemented with a variety of nonvolatile memory devices, such as, but not limited to, an electrically erasable and programmable ROM (EEPROM), a NAND flash memory, a NOR flash memory, a phase-change RAM (PRAM), a resistive RAM (ReRAM), a ferroelectric RAM (FRAM), a spin-torque magnetic RAM (STT-MRAM), and the like.

In example embodiments, the nonvolatile memory device 1200 may include a nonvolatile memory device described with reference to FIGS. 1 to 20. The nonvolatile memory device 1200 may perform a program operation based on a program pass or failure determining method described with reference to FIGS. 1 to 20.

In exemplary embodiments, the memory controller 1100 and the nonvolatile memory device 1200 may be integrated in a single semiconductor device. The memory controller 1100 and the nonvolatile memory device 1200 may be integrated in a single semiconductor device to form a solid state drive (SSD). The memory controller 1100 and the nonvolatile memory device 1200 may be integrated in a single semiconductor device to constitute a memory card. For example, the memory controller 1100 and the nonvolatile memory device 1200 may be integrated in a single semiconductor device to compose a memory card such as, but not limited to, a PC card (a personal computer memory card international association (PCMCIA) card), a compact flash card (CF), a smart media card (SM, SMC), a memory stick, a multimedia card (MMC, RS-MMC, MMCmicro), an SD card (SD, miniSD, microSD, SDHC), and a universal flash storage (UFS).

The nonvolatile memory device 1200 or the memory card system 1000 may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP). Alternatively, the nonvolatile memory device 1200 may include a plurality of nonvolatile memory chips, which are implemented in one of the above-described packaging technologies.

Figure 23:
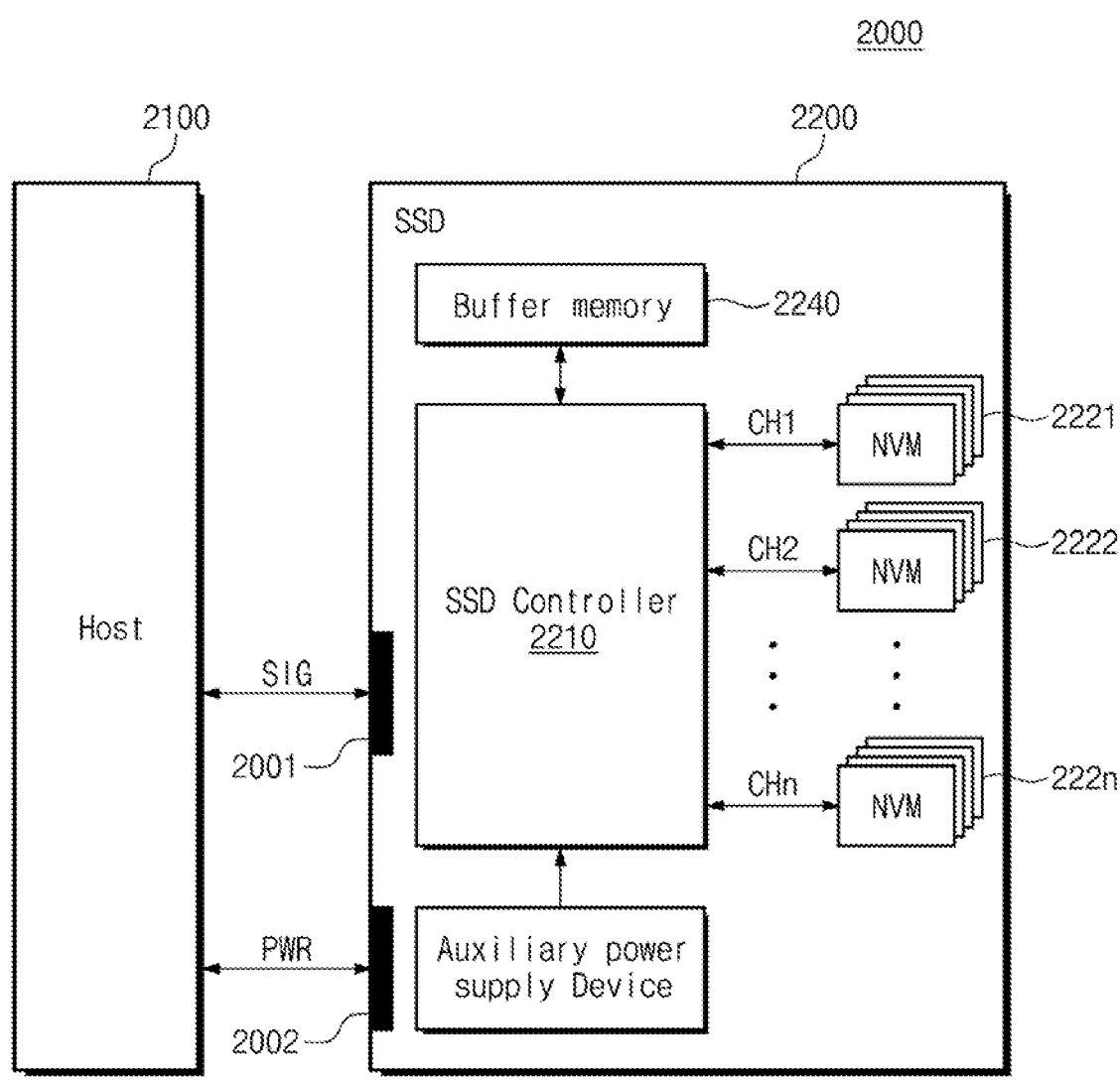
FIG. 23 illustrates an embodiment of a solid state drive system.

FIG. 23 illustrates an embodiment of a solid state drive (SSD) system 2000 including a storage device according to one or more embodiments. Referring to FIG. 23, the SSD system 2000 may include a host 2100 and an SSD 2200. The SSD 2200 may exchange signals SGL with the host 2100 through the host interface 2001 and may be supplied with a power through a power connector 2002. The SSD 2200 may include an SSD controller 2210, a plurality of flash memories 2221 to 322n, an auxiliary power supply 2230, and a buffer memory 2240.

The SSD controller 2210 may control the flash memories 2221 to 222n through a plurality of channels CH1 to CHn in response to a signal SIG from the host 2100. The flash memories 2221 to 222n may perform a program operation in response to control of the SSD controller 2210.

The auxiliary power supply 2230 may be connected to the host 2100 via the power connector 2002. The auxiliary power supply 2230 may be charged by a power PWR from the host 2100. When a power is not smoothly supplied from the host 2100, the auxiliary power supply 2230 may power the SSD system 2000. The auxiliary power supply 2230 may be placed inside or outside the SSD 2200. For example, the auxiliary power supply 2230 may be put on a main board to supply an auxiliary power to the SSD 2200.

The buffer memory 2240 may act as a buffer memory of the SSD 2200. For example, the buffer memory 2240 may temporarily store data received from the host 2100 or from the flash memories 2221 to 222n or may temporarily store metadata (e.g., mapping tables) of the flash memories 2221 to 222n. The buffer memory 2240 may include volatile memories such as a DRAM, a SDRAM, a DDR SDRAM, an LPDDR SDRAM, an SRAM, and the like or nonvolatile memories such as a FRAM a ReRAM, a STT-MRAM, a PRAM, and the like.

In example embodiments, each of the flash memories 2221 to 222n may include a nonvolatile memory device described with reference to FIGS. 1 to 20. Each of the flash memories 2221 to 222n may perform a program operation based on a program pass or failure determining method described with reference to FIGS. 1 to 20.

Figure 24:
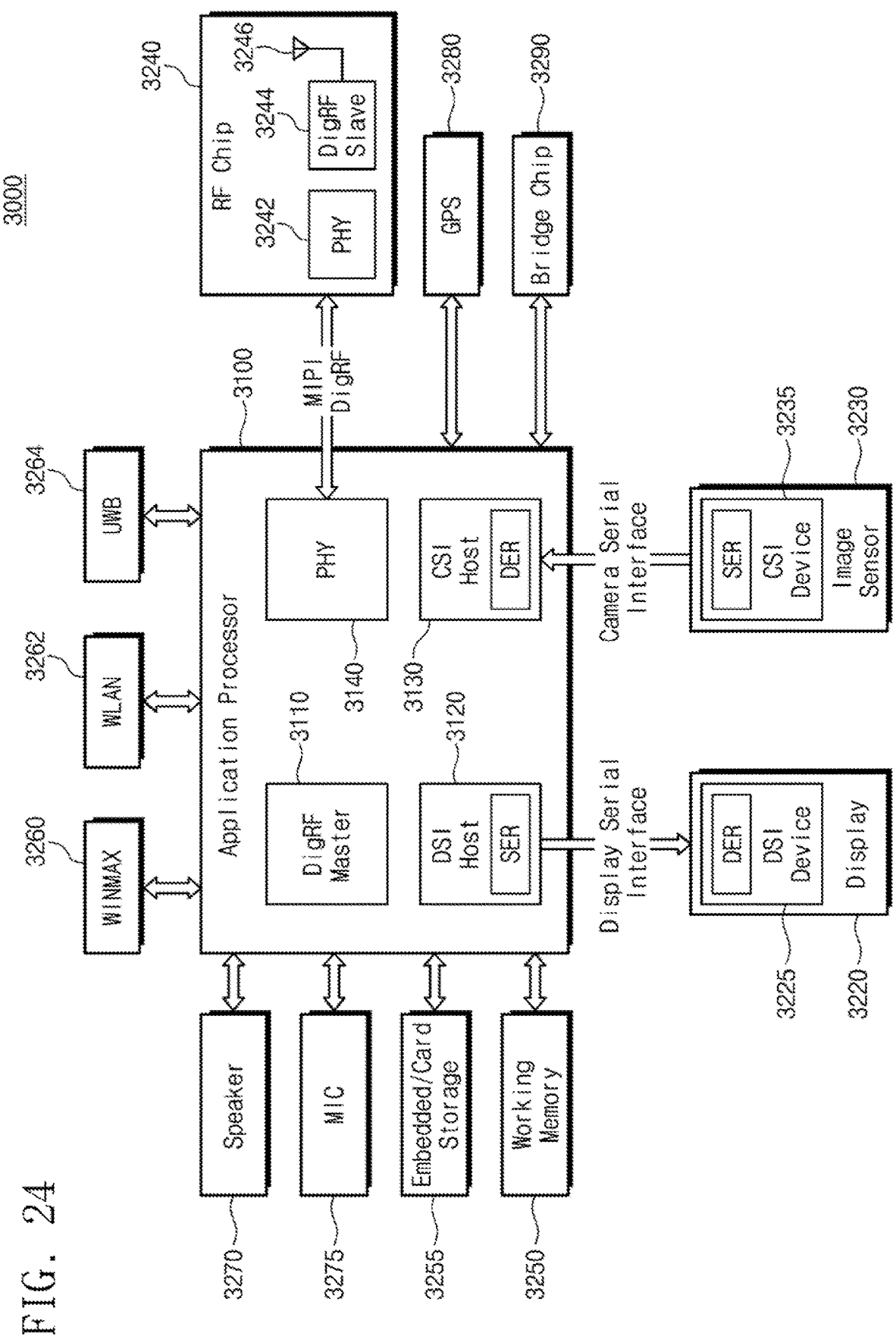
FIG. 24 illustrates an embodiment of an electronic system.

FIG. 24 illustrates an embodiment of an electronic system 3000 including a storage device and interfaces operating according to one or more embodiments. The electronic system 3000 may be implemented with a data processing device, for example, capable of using or supporting an interface offered by mobile industry processor interface (MIPI) alliance. In example embodiments, the electronic system 3000 may be implemented with an electronic device such as a portable communication terminal, a personal digital assistant (PDA), a portable multimedia player (PMP), a smart phone, or a wearable device, or the like.

The electronic system 3000 may include an application processor 3100, a display 3220, and an image sensor 3230. The application processor 3100 may include a DigRF master 3110, a display serial interface (DSI) host 3120, a camera serial interface (CSI) host 3130, and a physical layer 3140.

The DSI host 3120 may communicate with a DSI device 3225 of the display 3220 through DSI. For example, an optical serializer SER may be implemented in the DSI host 3120, and an optical deserializer DES may be implemented in the DSI device 3225.

The CSI host 3130 may communicate with a CSI device 3235 of the image sensor 3230 through a CSI. For example, an optical deserializer may be implemented in the CSI host 3130, and an optical serializer may be implemented in the CSI device 3235.

DSI and CSI may use a physical layer and a link layer. One or more embodiments may be applied to the DSI and CSI.

The electronic system 3000 may further include a radio frequency (RF) chip 3240 for communicating with the application processor 3100. The RF chip 3240 may include a physical layer 3242, a DigRF slave 3244, and an antenna 3246. For example, the physical layer 3242 of the RF chip 3240 and the physical layer 3140 of the application processor 3100 may exchange data with each other through DigRF interface offered by MIPI alliance.

The electronic system 3000 may further include a working memory 3250 and embedded/card storage 3255. The working memory 3250 and the embedded/card storage 3255 may store data received from the application processor 3100. The working memory 3250 and the embedded/card storage 3255 may provide the data stored therein to the application processor 3100.

The working memory 3250 may temporarily store data, which was processed or will be processed by the application processor 3100. The working memory 3250 may include a nonvolatile memory, such as a flash memory, a PRAM, an MRAM, a ReRAM, or a FRAM, or a volatile memory, such as an SRAM, a DRAM, or an SDRAM.

The embedded/card storage 3255 may store data regardless of a power supply. In example embodiments, the embedded/card storage 3255 may comply with the UFS interface protocol. In example embodiments, the embedded/card storage 3255 may include a nonvolatile memory device described with reference to FIGS. 1 to 20. A nonvolatile memory device included in the embedded/card storage 3255 may perform a program operation based on a program pass or failure determining method described with reference to FIGS. 1 to 20.

The electronic system 3000 may communicate with an external system through a communication module such as a worldwide interoperability for microwave access (WiMAX) 3260, a wireless local area network (WLAN) 3262, and an ultra-wideband (UWB) 3264, or the like.

The electronic system 3000 may further include a speaker 3270 and a microphone 3275 for processing voice information. The electronic system 3000 may further include a global positioning system (GPS) device 3280 for processing position information. The electronic system 3000 may further include a bridge chip 3290 for managing connections between peripheral devices.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, checkers, decoders, and other processing features of the embodiments disclosed herein may be implemented in logic which, for example, may include hardware, software, or both. When implemented at least partially in hardware, the controllers, checkers, decoders, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, checkers, decoders, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments described herein.

Figure 25:
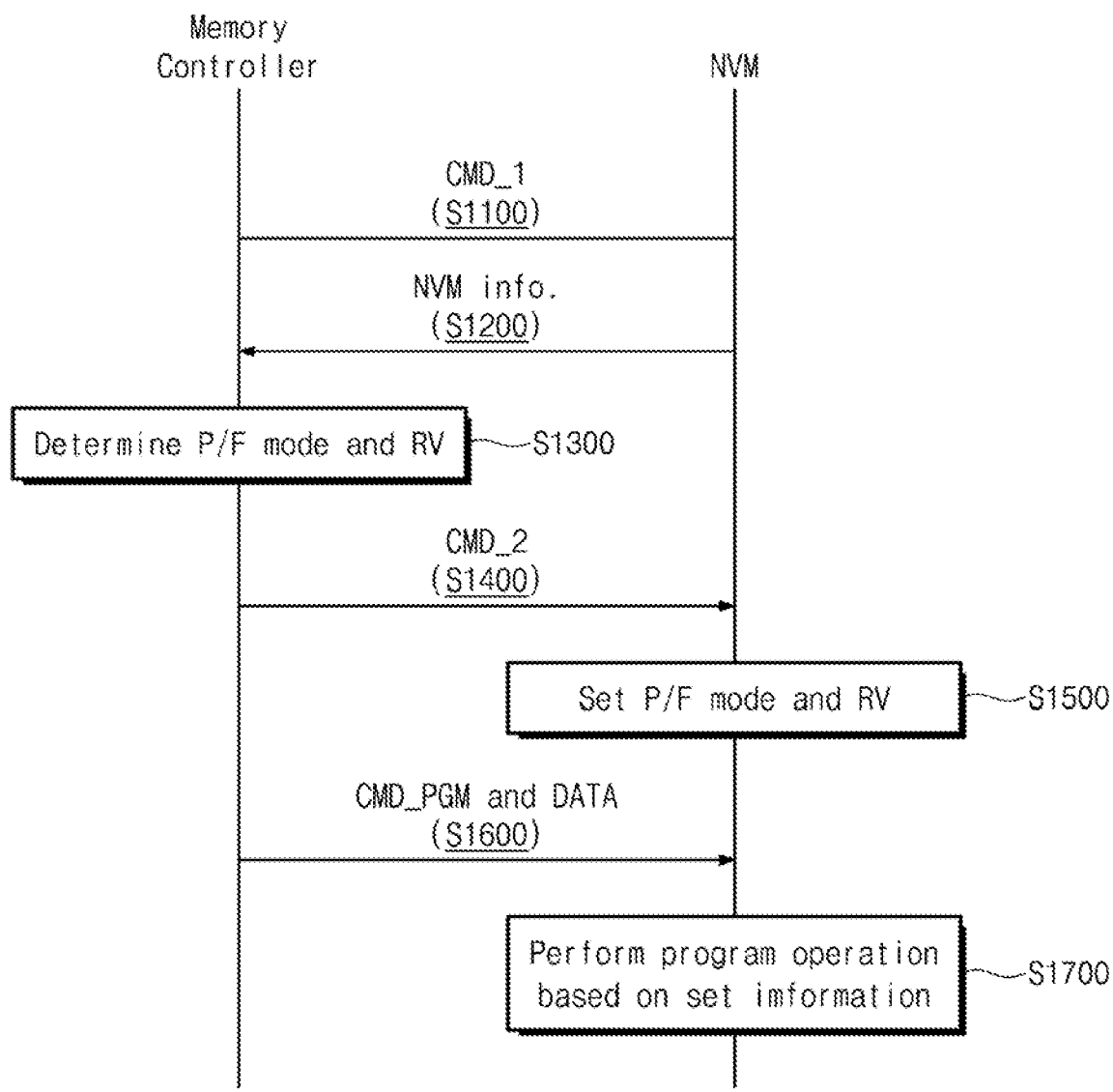
FIG. 25 illustrates an embodiment of an operation of the nonvolatile memory device.

FIG. 25 is a flowchart illustrating an operation method of a nonvolatile memory system or a storage device according to an embodiment of the inventive concept. For convenience of description, the flowchart of FIG. 25 will be described with reference to the nonvolatile memory system 100 of FIG. 1. However, the inventive concept is not limited thereto. For example, operations according to the flowchart of FIG. 25 may be performed by a nonvolatile memory device or a memory controller according to various embodiments described above.

Referring to FIGS. 1 and 25, in operation S1100, the memory controller 110 may transmit the first command CMD1 to the nonvolatile memory device 120. In an exemplary embodiment, the first command CMD1 may be a command for getting device information of the nonvolatile memory device 120. In an exemplary embodiment, the first command CMD1 may be a "GET FEATURE" command.

In operation S1200, the nonvolatile memory device 120 may transmit device information NVM info. to the memory controller 110 in response to the first command CMD1. In an exemplary embodiment, the device information NVM info. including information about physical features of the nonvolatile memory device 120 such as the number of program/erase cycles, a read count, and a device temperature, and operation information, which is necessary for the nonvolatile memory device 120 to operate, such as a program voltage, a verification voltage, and a program verification reference value. In an exemplary embodiment, the device information NVM info. may include mode information indicating whether to support the operations (e.g., the operations of predicting program pass and program failure) described with reference to FIGS. 1 to 24.

In operation S1300, the memory controller 110 may determine a P/F mode and a reference value RV of the nonvolatile memory device 120, based on the received device information NVM info. For example, the memory controller 110 may determine the reference value RV (i.e., a reference value used at each stage to predict program pass or program failure) described with reference to FIGS. 1 to 24 based on the number of program/erase cycles included in the device information NVM info. In an exemplary embodiment, in operation S1300, the memory controller 110 may determine an initial reference value and an increment of a reference value. The initial reference value may indicate a reference value (i.e., a reference value first used) in a first stage or in a comparison operation first performed, like RV_1 of FIG. 8. The increment of the reference value may indicate a magnitude by which the reference value is increased as each stage is performed.

The memory controller 110 may determine the P/F mode of the nonvolatile memory device 120 based on the mode information included in the device information NVM info. In an exemplary embodiment, the P/F mode may include a program failure prediction mode, a program pass prediction mode, a program pass/failure prediction mode. The program failure prediction mode may be a mode that is executed based on the method described with reference to FIGS. 5 to 14, the program pass prediction mode may be a mode that is executed based on the method described with reference to FIGS. 15 to 17, and the program pass/failure prediction mode may be a mode that is executed based on the method described with reference to FIGS. 18 to 20.

However, the inventive concept is not limited thereto. For example, the memory controller 110 may determine a variety of information to be used in program verification, based on the device information NVM info. received from the nonvolatile memory device 120.

In operation S1400, the memory controller 110 may transmit a second command CMD2 to the nonvolatile memory device 120. In an exemplary embodiment, the second command CMD2 may be a command for setting the P/F mode and the reference value RV determined in operation S1300 to the nonvolatile memory device 120. The second command CMD2 may be a "SET FEATURE" command.

In operation S1500, the nonvolatile memory device 120 may set the R/F mode and the reference value RV in response to the second command CMD2.

In operation S1600, the memory controller 110 may transmit a program command CMD_PGM and data "DATA" to the nonvolatile memory device 120. In operation S1700, the nonvolatile memory device 120 may perform the program operation based on the information set in operation S1500. For example, based on the set P/F mode, the nonvolatile memory device 120 may perform one of operations of predicting and determining program pass/failure, which are described with reference to FIGS. 1 to 24. In this case, the reference value RV (or PRV or FRV) may be a value set by the memory controller 110. For convenience of description, the program operation is described, but the inventive concept is not limited thereto. For example, the inventive concept may be applied to an erase verification operation as in the above description.

In an exemplary embodiment, operation S1100 to operation S1500 may be performed in an initialization operation of the nonvolatile memory system 100. In an exemplary embodiment, operation S1100 to operation S1500 may be performed in an initialization operation of the nonvolatile memory system 100.

As described above, the memory controller 110 of the nonvolatile memory system 100 according to an embodiment of the inventive concept may set the P/F mode and the reference value RV for a pass/failure predicting operation to be performed at the nonvolatile memory device 120, based on the device information NVM info. of the nonvolatile memory device 120. Accordingly, because the P/F mode or the reference value RV is capable of being adjusted depending on states of the nonvolatile memory device 120, the performance and reliability of the nonvolatile memory system 100 may be improved.

Figure 26:
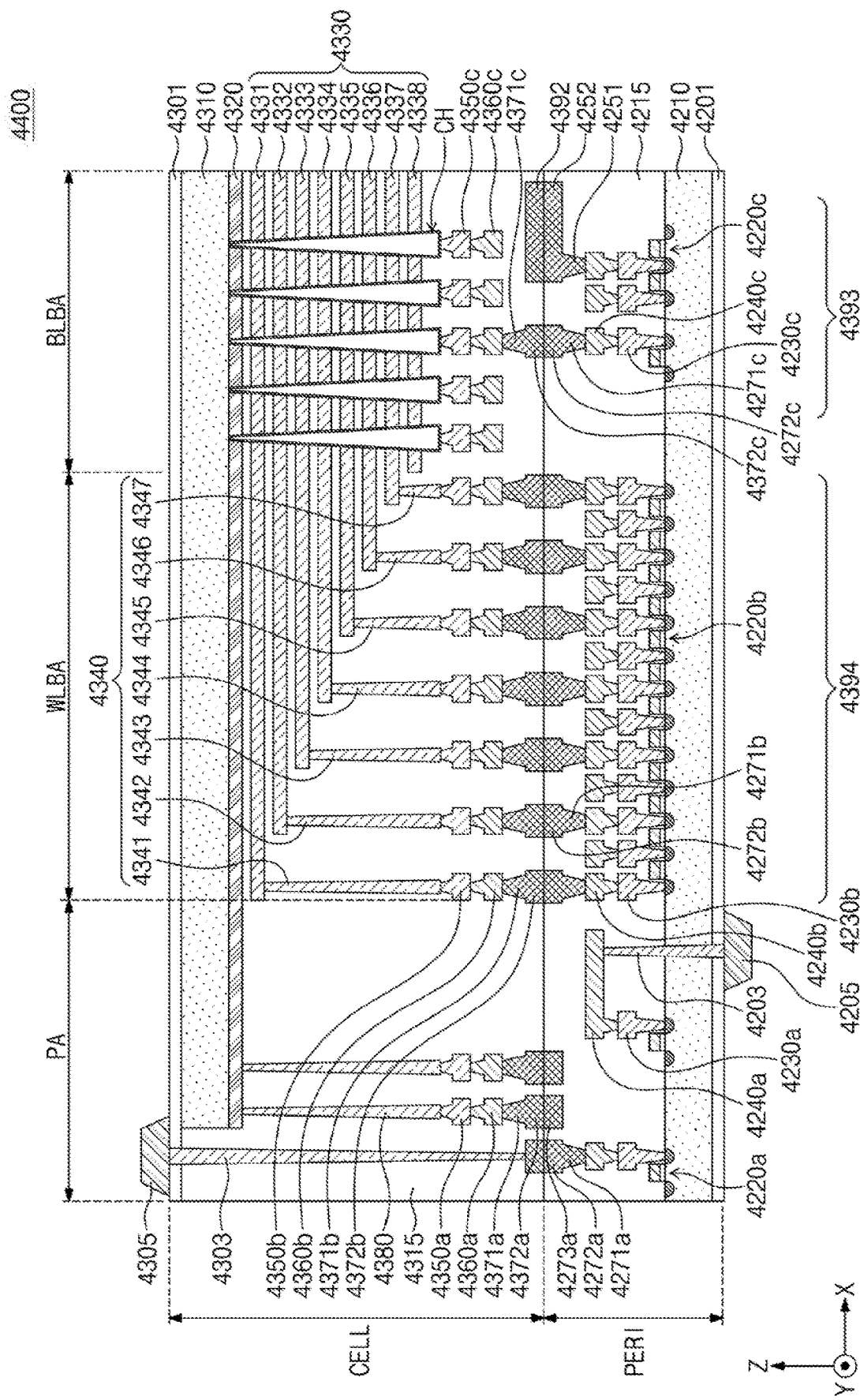
FIG. 26 is a diagram illustrating an exemplary nonvolatile memory device.

FIG. 26 is a diagram illustrating an exemplary nonvolatile memory device. Referring to FIG. 26, a memory device 4400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 4400 may include an external pad bonding area PA, a word line bonding area WLBA, and a bit line bonding area BLBA.

The peripheral circuit region PERI may include a first substrate 4210, an interlayer insulating layer 4215, a plurality of circuit elements 4220a, 4220b, and 4220c formed on the first substrate 4210, first metal layers 4230a, 4230b, and 4230c respectively connected to the plurality of circuit elements 4220a, 4220b, and 4220c, and second metal layers 4240a, 4240b, and 4240c formed on the first metal layers 4230a, 4230b, and 4230c. In an example embodiment, the first metal layers 4230a, 4230b, and 4230c may be formed of tungsten having relatively high resistance, and the second metal layers 4240a, 4240b, and 4240c may be formed of copper having relatively low resistance.

In an example embodiment illustrated in FIG. 26, although the first metal layers 4230a, 4230b, and 4230c and the second metal layers 4240a, 4240b, and 4240c are shown and described, they are not limited thereto, and one or more metal layers may be further formed on the second metal layers 4240a, 4240b, and 4240c. At least a portion of the one or more metal layers formed on the second metal layers 4240a, 4240b, and 4240c may be formed of aluminum or the like having a lower resistance than those of copper forming the second metal layers 4240a, 4240b, and 4240c.

The interlayer insulating layer 4215 may be disposed on the first substrate 4210 and cover the plurality of circuit elements 4220a, 4220b, and 4220c, the first metal layers 4230a, 4230b, and 4230c, and the second metal layers 4240a, 4240b, and 4240c. The interlayer insulating layer 4215 may include an insulating material such as silicon oxide, silicon nitride, or the like.

Lower bonding metals 4271b and 4272b may be formed on the second metal layer 4240b in the word line bonding area WLBA. In the word line bonding area WLBA, the lower bonding metals 4271b and 4272b in the peripheral circuit region PERI may be electrically connected to upper bonding metals 4371b and 4372b in the cell region CELL in a bonding manner, and the lower bonding metals 4271b and 4272b and the upper bonding metals 4371b and 4372b may be formed of aluminum, copper, tungsten, or the like.

Further, the upper bonding metals 4371b and 4372b in the cell region CELL may be referred as first metal pads and the lower bonding metals 4271b and 4272b in the peripheral circuit region PERI may be referred as second metal pads.

The cell region CELL may include at least one memory block. The cell region CELL may include a second substrate 4310, an interlayer insulating layer 4315 and a common source line 4320. On the second substrate 4310, a plurality of word lines 4331 to 4338 (i.e., 4330) may be stacked in a direction (a Z-axis direction), perpendicular to an upper surface of the second substrate 4310. At least one string select line and at least one ground select line may be arranged on and below the plurality of word lines 4330, respectively, and the plurality of word lines 4330 may be disposed between the at least one string select line and the at least one ground select line.

Widths of the plurality of word lines 4330 along the X-direction may be different each other. As a distance from the first substrate 4210 of the peripheral circuit region PERI to respective one of the plurality of word line 4330 increases, the width of the respective one of the plurality of word line 4330 decreases. Similarly, as a distance from the second substrate 4310 of the cell region CELL to respective one of the plurality of word line 4330 increases, the width of the respective one of the plurality of word line 4330 increases.

In the bit line bonding area BLBA, a channel structure CH may extend in a direction, perpendicular to the upper surface of the second substrate 4310, and pass through the plurality of word lines 4330, the at least one string select line, and the at least one ground select line. The channel structure CH may include a data storage layer, a channel layer, a buried insulating layer, and the like, and the channel layer may be electrically connected to a first metal layer 4350c and a second metal layer 4360c. For example, the first metal layer 4350c may be a bit line contact, and the second metal layer 4360c may be a bit line. In an example embodiment, the bit line 4360c may extend in a first direction (a Y-axis direction), parallel to the upper surface of the second substrate 4310.

The interlayer insulating layer 4315 may be disposed on the second substrate 4310 and cover the common source line 4320, the plurality of word lines 4330, the plurality of cell contact plugs 4340, the first metal layer 4350a, 4350b and 4350c, and the second metal layer 4360a, 4360b and 4360b. The interlayer insulating layer 4315 may include an insulating material such as silicon oxide, silicon nitride, or the like.

In an example embodiment illustrated in FIG. 26, an area in which the channel structure CH, the bit line 4360c, and the like are disposed may be defined as the bit line bonding area BLBA. In the bit line bonding area BLBA, the bit line 4360c may be electrically connected to the circuit elements 4220c providing a page buffer 4393 in the peripheral circuit region PERI. For example, the bit line 4360c may be connected to upper bonding metal pads 4371c and 4372c in the cell region CELL, and the upper bonding metal pads 4371c and 4372c may be connected to lower bonding metal pads 4271c and 4272c connected to the circuit elements 4220c of the page buffer 4393.

In the word line bonding area WLBA, the plurality of word lines 4330 may extend in a second direction (an X-axis direction), parallel to the upper surface of the second substrate 4310, and may be connected to a plurality of cell contact plugs 4341 to 4347 (i.e., 4340). The plurality of word lines 4330 and the plurality of cell contact plugs 4340 may be connected to each other in pads provided by at least a portion of the plurality of word lines 4330 extending in different lengths in the second direction. A first metal layer 4350b and a second metal layer 4360b may be connected to an upper portion of the plurality of cell contact plugs 4340 connected to the plurality of word lines 4330, sequentially. The plurality of cell contact plugs 4340 may be connected to the circuit region PERI by the upper bonding metals 4371b and 4372b of the cell region CELL and the lower bonding metals 4271b and 4272b of the peripheral circuit region PERI in the word line bonding area WLBA.

The plurality of cell contact plugs 4340 may be electrically connected to the circuit elements 4220b providing a row decoder 4394 in the peripheral circuit region PERI. In an example embodiment, operating voltages of the circuit elements 4220b providing the row decoder 4394 may be different than operating voltages of the circuit elements 4220c providing the page buffer 4393. For example, operating voltages of the circuit elements 4220c providing the page buffer 4393 may be greater than operating voltages of the circuit elements 4220b providing the row decoder 4394.

A common source line contact plug 4380 may be disposed in the external pad bonding area PA. The common source line contact plug 4380 may be formed of a conductive material such as a metal, a metal compound, polysilicon, or the like, and may be electrically connected to the common source line 4320. A first metal layer 4350a and a second metal layer 4360a may be stacked on an upper portion of the common source line contact plug 4380, sequentially. For example, an area in which the common source line contact plug 4380, the first metal layer 4350a, and the second metal layer 4360a are disposed may be defined as the external pad bonding area PA.

Input-output pads 4205 and 4305 may be disposed in the external pad bonding area PA. Referring to FIG. 26, a lower insulating film 4201 covering a lower surface of the first substrate 4210 may be formed below the first substrate 4210, and a first input-output pad 4205 may be formed on the lower insulating film 4201. The first input-output pad 4205 may be connected to at least one of the plurality of circuit elements 4220a, 4220b, and 4220c disposed in the peripheral circuit region PERI through a first input-output contact plug 4203, and may be separated from the first substrate 4210 by the lower insulating film 4201. In addition, a side insulating film may be disposed between the first input-output contact plug 4203 and the first substrate 4210 to electrically separate the first input-output contact plug 4203 and the first substrate 4210.

Referring to FIG. 26, an upper insulating film 4301 covering the upper surface of the second substrate 4310 may be formed on the second substrate 4310, and a second input-output pad 4305 may be disposed on the upper insulating film 4301. The second input-output pad 4305 may be connected to at least one of the plurality of circuit elements 4220a, 4220b, and 4220c disposed in the peripheral circuit region PERI through a second input-output contact plug 4303.

According to embodiments, the second substrate 4310 and the common source line 4320 may not be disposed in an area in which the second input-output contact plug 4303 is disposed. Also, the second input-output pad 4305 may not overlap the word lines 4330 in the third direction (the Z-axis direction). Referring to FIG. 26, the second input-output contact plug 4303 may be separated from the second substrate 4310 in a direction, parallel to the upper surface of the second substrate 4310, and may pass through the interlayer insulating layer 4315 of the cell region CELL to be connected to the second input-output pad 4305 and the lower bonding metals 4271a and 4272a of the peripheral circuit area PERI.

According to embodiments, the first input-output pad 4205 and the second input-output pad 4305 may be selectively formed. For example, the memory device 4400 may include only the first input-output pad 4205 disposed on the first substrate 4210 or the second input-output pad 4305 disposed on the second substrate 4310. Alternatively, the memory device 4400 may include both the first input-output pad 4205 and the second input-output pad 4305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 4400 may include a lower metal pattern 4273a, corresponding to an upper metal pattern 4372a formed in an uppermost metal layer of the cell region CELL, and having the same shape as the upper metal pattern 4372a of the cell region CELL, in an uppermost metal layer of the peripheral circuit region PERI. In the peripheral circuit region PERI, the lower metal pattern 4273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 4271b and 4272b may be formed on the second metal layer 4240b in the word line bonding area WLBA. In the word line bonding area WLBA, the lower bonding metals 4271b and 4272b of the peripheral circuit region PERI may be electrically connected to the upper bonding metals 4371b and 4372b of the cell region CELL by a Cu—Cu bonding.

Further, the bit line bonding area BLBA, an upper metal pattern 4392, corresponding to a lower metal pattern 4252 formed in the uppermost metal layer of the peripheral circuit region PERI, and having the same shape as the lower metal pattern 4252 of the peripheral circuit region PERI, may be formed in an uppermost metal layer of the cell region CELL. A contact may not be formed on the upper metal pattern 4392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

In an exemplary embodiment, a memory device 4400 of FIG. 26 may be one of the nonvolatile memory devices described with reference to FIGS. 1 to 25. The memory cell array 121 described with reference to FIGS. 1 to 25 may be included in a memory cell region CELL of FIG. 26. Peripheral circuits, which are described with reference to FIGS. 1 to 25, such as the corresponding one of the page buffer circuits 125, 225, and 325, the corresponding one of the P/F checkers 127, 227, and 327, the corresponding one of the control circuits 124, 224, and 324, the voltage generator 123, the address decoder 122, and the input/output circuit 126 may be included in a peripheral circuit region PERI of FIG. 26. For convenience of description, below, a configuration of the memory device 4400 of FIG. 26 will be described with reference to the nonvolatile memory device 120 of FIG. 2.

The page buffer circuit 125 may be connected with the memory cell array 121 through bonding metal pads 4371c, 4372c, 4271c, and 4272c of FIG. 26. The bonding metal pads 4371c, 4372c, 4271c, and 4272c may be components for electrically connecting the bit lines BL of the memory cell array 121 and the page buffer circuit 125.

The page buffer circuit 125 may receive a result of a verification read operation VFY_R through the bonding metal pads 4371c, 4372c, 4271c, and 4272c. The page buffer circuit 125 may divide the result of the verification read operation VFY_R to a plurality of stages based on the method described with reference to FIGS. 1 to 24 and may sequentially transfer values corresponding to the plurality of stages to the P/F checker 127. In an exemplary embodiment, the values corresponding to the plurality of stages may be transmitted from the page buffer circuit 125 to the P/F checker 127 through metal layers 4240a, 4240b, 4240c, 4230a, 4230b, and 4230c of the peripheral circuit region PERI of FIG. 26.

The P/F checker 127 may perform program failure prediction or program pass prediction based on the method described with reference to FIGS. 1 to 24. The control circuit 124 may perform the following program loop by controlling voltages of a plurality of word lines (refer to 4330 of FIG. 26) based on a prediction result of the P/F checker 127 or may transmit information about a program result to the memory controller 110.

In an exemplary embodiment, the information about the program result may be provided to the memory controller 110 through input-output pads 4205 or 4305 in response to a status read command from the memory controller 110 (refer to FIG. 1).

In an exemplary embodiment, information (e.g., a P/F mode and a reference value) necessary for the nonvolatile memory device 120 to perform program failure prediction or program pass prediction may be determined based on information received from the memory controller 110 through the input-output pads 4205 or 4305.

In accordance with one or more of the aforementioned embodiments, a nonvolatile memory device may change a pass reference value and a failure reference value for determining program pass or program failure during a determination operation. Thus, program pass or program failure may be determined in advance in a determination operation of a program pass before a counting operation about all stages is performed. This may mean that a program speed of the nonvolatile memory device is improved. Thus, performance may be improved by reducing overhead due to a failure bit counting operation.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed:

1. A memory device comprising:
a first substrate;
a peripheral circuit provided on the first substrate, the peripheral circuit including a page buffer circuit and a pass/fail (P/F) checker;
a first metal bonding layer provided on the peripheral circuit;
a second metal bonding layer provided on the first metal bonding layer, and directly bonded to the first metal bonding layer;
a memory cell array provided on the second metal bonding layer, and electrically connected to the peripheral circuit through the first metal bonding layer and the second metal bonding layer; and
a second substrate provided on the memory cell array, wherein:
the page buffer circuit is configured to receive a verification read result at a verification read operation on the memory cell array through the first metal bonding layer and the second metal bonding layer, to divide the verification read result into a plurality of stages, and to sequentially output the verification read result for the division into the plurality of stages,
the P/F checker is configured to sequentially perform a failure bit counting operation about each of the plurality of stages to generate a plurality of failure bit accumulated values, and compare the failure bit accumulated values and a reference value to output one of a pass signal and a failure signal,
the reference value increases from an initial value as the failure bit counting operation is performed, and
the initial value is set by an external memory controller.

2. The memory device of claim 1, wherein the memory cell array is connected to a plurality of bit lines,
the page buffer circuit comprises a plurality of page buffers connected to the plurality of bit lines through the first and second metal bonding layers, respectively, and
the plurality of page buffers are divided into the plurality of stages.

3. The memory device of claim 1, wherein the P/F checker comprises:
a counting unit configured to sequentially perform a failure bit counting operation about each of the plurality of stages to generate counting values;
an accumulating unit configured to accumulate the counting values to generate the failure bit accumulated values;

a reference value managing unit configured to control the reference value based on a progress of the failure bit counting operation; and a comparing unit configured to compare the failure bit accumulated values and the reference value to output one of the pass signal and the failure signal based on a result of the comparison.

4. The memory device of claim 1, wherein the peripheral circuit further comprises a control circuit configured to transmit a transmission signal to the page buffer circuit, and the page buffer circuit sequentially outputs the verification read result, for the division into the stages, in response to the transmission signal.

5. The memory device of claim 4, wherein the control circuit is further configured to transmit transmission information to the P/F checker, and the transmission information includes information corresponding to a number of activated stages from among the plurality of stages.

6. The memory device of claim 5, wherein the P/F checker increases the reference value in response to the transmission information.

7. The memory device of claim 1, wherein the peripheral circuit further comprises metal layers provided between the first metal bonding layer, and the page buffer circuit and the P/F checker.

8. The memory device of claim 7, wherein the verification read result is transmitted from the page buffer circuit to the P/F checker through the metal layers.

9. The memory device of claim 1, wherein an upper input/output (I/O) pad is provided on the second substrate, the upper I/O pad is electrically connected to the peripheral circuit through the first metal bonding layer and the second metal bonding layer, and information corresponding to the initial value is received from the external memory controller through the upper I/O pad.

10. The memory device of claim 1, wherein a lower input/output (I/O) pad is provided under the first substrate, and information corresponding to the initial value is received from the external memory controller through the lower I/O pad.

11. An operation method of a storage device including a nonvolatile memory device and a memory controller configured to control the nonvolatile memory device, the operation method comprising:

transmitting, by the memory controller, a first command to the nonvolatile memory device, the first command being a GET FEATURE command;

transmitting, by the nonvolatile memory device, device information to the memory controller in response to the first command;

determining, by the memory controller, a pass/failure mode and a reference value based on the device information;

transmitting, by the memory controller, a second command including information corresponding to the determined pass/failure mode and the determined reference value to the nonvolatile memory device, the second command being a SET FEATURE command;

setting, by the nonvolatile memory device, the pass/failure mode and the reference value;

transmitting, by the memory controller, a program command and data to the nonvolatile memory device; and performing, by the nonvolatile memory device, a program operation for the data in response to the program command, wherein:

the program operation includes a program step and a verification step, and the verification step is performed based on the set pass/failure mode and the set reference value.

12. The operation method of claim 11, wherein:

the set reference value includes a first failure reference value and a second failure reference value different from the first failure reference value, the verification step comprises:

performing a first failure bit counting operation about a first stage of a plurality of stages to generate a first failure bit accumulated value;

comparing the first failure bit accumulated value and the first failure reference value to determine a program failure; and when the first failure bit accumulated value is less than the first failure reference value;

performing a second failure bit counting operation about a second stage of the stages to generate a second failure bit accumulated value; and comparing the second failure bit accumulated value and the second failure reference value.

13. The operation method of claim 12, wherein comparing the first failure bit accumulated value includes:

determining a case that the first failure bit accumulated value is less than a first pass reference value as being a program pass.

14. The operation method of claim 13, wherein when the first failure bit accumulated value is less than the first pass reference value, the performing a second failure bit counting operation and the comparing the second failure bit accumulated value and the second failure reference value are skipped.

15. The operation method of claim 13, wherein the first failure reference value is less than the second failure reference value.

16. The operation method of claim 11, wherein the device information includes a number of program/erase cycles of the nonvolatile memory device, and the reference value is determined based on the number of program/erase cycles.

17. A storage device comprising:

a nonvolatile memory device; and a memory controller configured to set an initial reference value based on device information of the nonvolatile memory device, wherein:

the nonvolatile memory device comprises:

a memory cell array;

a page buffer circuit configured to store a verification read result at a verification read operation on the memory cell array, to divide the verification read result into a plurality of stages, and to sequentially output the verification read result for the division into the plurality of stages; and a pass/failure (P/F) checker configured to sequentially perform a failure bit counting operation about each of the plurality of stages to generate a plurality of failure bit accumulated values, and compare the failure bit accumulated values and a reference value to output one of a pass signal and a failure signal, and the reference value increases from the initial reference value as the failure bit counting operation is performed.

18. The storage device of claim 17, wherein the nonvolatile memory device further comprises a first substrate and a second substrate, and the memory cell array, the page buffer circuit, and the P/F checker are provided between the first substrate and the second substrate.

19. The storage device of claim 18, wherein the nonvolatile memory device further comprises:

a first metal bonding layer electrically connected to the page buffer circuit; and a second metal bonding layer electrically connected to the memory cell array, wherein the second metal bonding layer is directly bonded to the first metal bonding layer.

20. The storage device of claim 19, wherein the page buffer circuit is further configured to receive the verification read result from the memory cell array through the first metal bonding layer and the second metal bonding layer.

* * * * *